(12) United States Patent
Yamada et al.

(10) Patent No.: US 7,821,138 B2
(45) Date of Patent: Oct. 26, 2010

(54) SEMICONDUCTOR DEVICE WITH AN IMPROVED OPERATING PROPERTY

(75) Inventors: Masaru Yamada, Toyama (JP); Masafumi Tsutsui, Otsu (JP); Kiyoyuki Morita, Yawata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/405,668

(22) Filed: Mar. 17, 2009

(65) Prior Publication Data

US 2009/0200582 A1    Aug. 13, 2009

Related U.S. Application Data

(62) Division of application No. 11/258,034, filed on Oct. 26, 2005, now abandoned.

(30) Foreign Application Priority Data

Dec. 17, 2004  (JP)  ............................. 2004-366215

(51) Int. Cl.
    *H01L 23/48*   (2006.01)
(52) U.S. Cl. ..................... 257/774; 257/69; 257/206; 257/274; 257/368; 257/369; 257/374; 257/E23.145
(58) Field of Classification Search .................. 257/69, 257/206, 369, 374, 368, 774, 274, E23.145
See application file for complete search history.

(56) References Cited

U.S. PATENT DOCUMENTS 6,982,465 B2 *  1/2006  Kumagai et al. ............ 257/369

FOREIGN PATENT DOCUMENTS

| JP | 10-173065    | 6/1998  |
|----|--------------|---------|
| JP | 2001-332706  | 11/2001 |
| JP | 2002-246464  | 8/2002  |
| JP | 2003-086708  | 3/2003  |
| JP | 2003-179157  | 6/2003  |
| JP | 2004-335741  | 11/2004 |

OTHER PUBLICATIONS

Japanese Office Action issued in Japanese Patent Application No. JP 2004-366215 dated Dec. 15, 2009.

* cited by examiner

*Primary Examiner*—Tan N Tran
(74) *Attorney, Agent, or Firm*—McDermott Will & Emery LLP

(57) ABSTRACT

The semiconductor comprises an n-channel transistor forming region and a p-channel transistor forming region, which are disposed while being sectioned by an element isolation region. The stress caused by contact plugs in the n-channel transistor forming region and the stress caused by contact plugs in the p-channel transistor forming region are made different from each other. With this, it enables to increase the drive current of both the n-channel transistor and p-channel transistor without changing the dimensions of the active region and the element isolation region.

23 Claims, 15 Drawing Sheets

F I G. 1 A
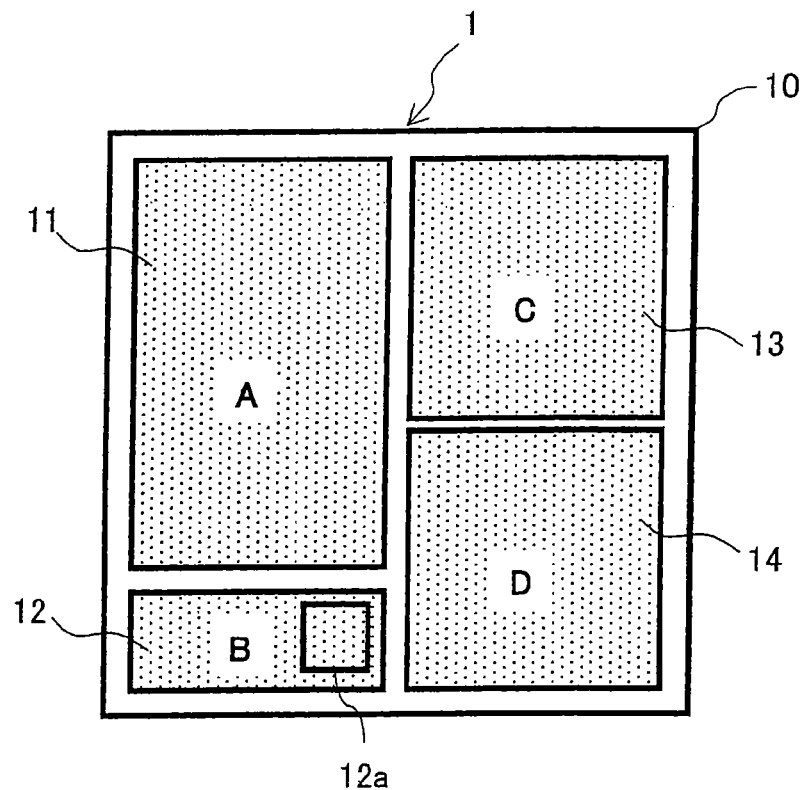
F I G. 1 B
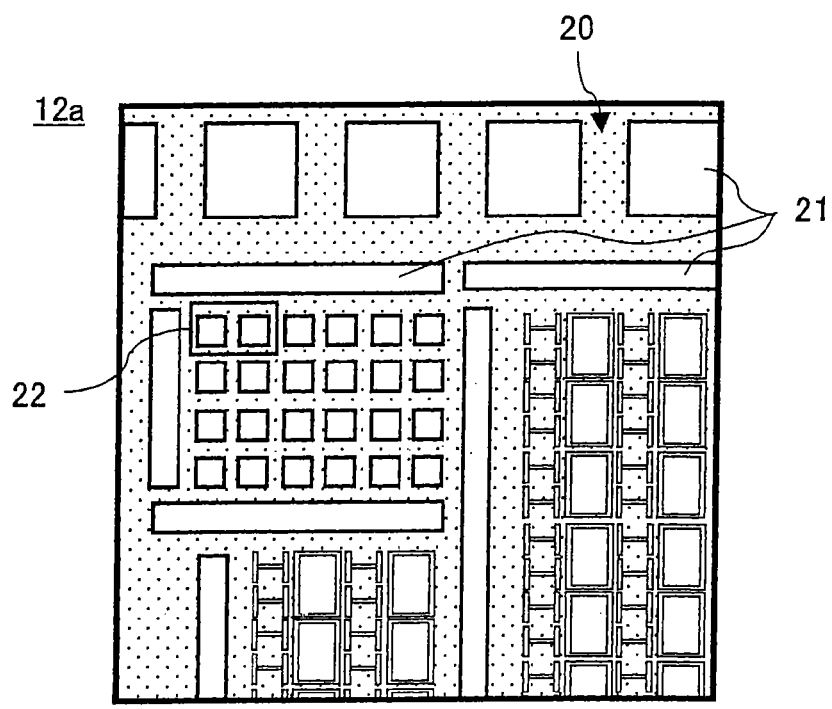

F I G. 3
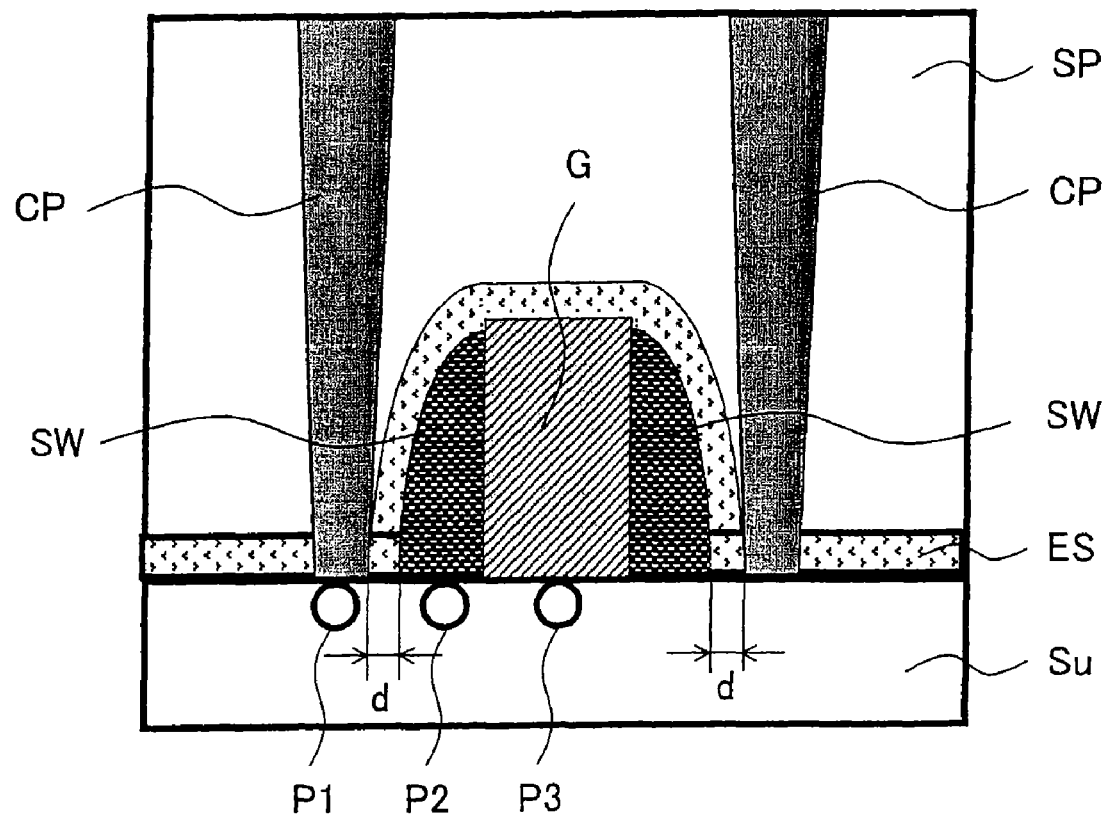

F I G. 4
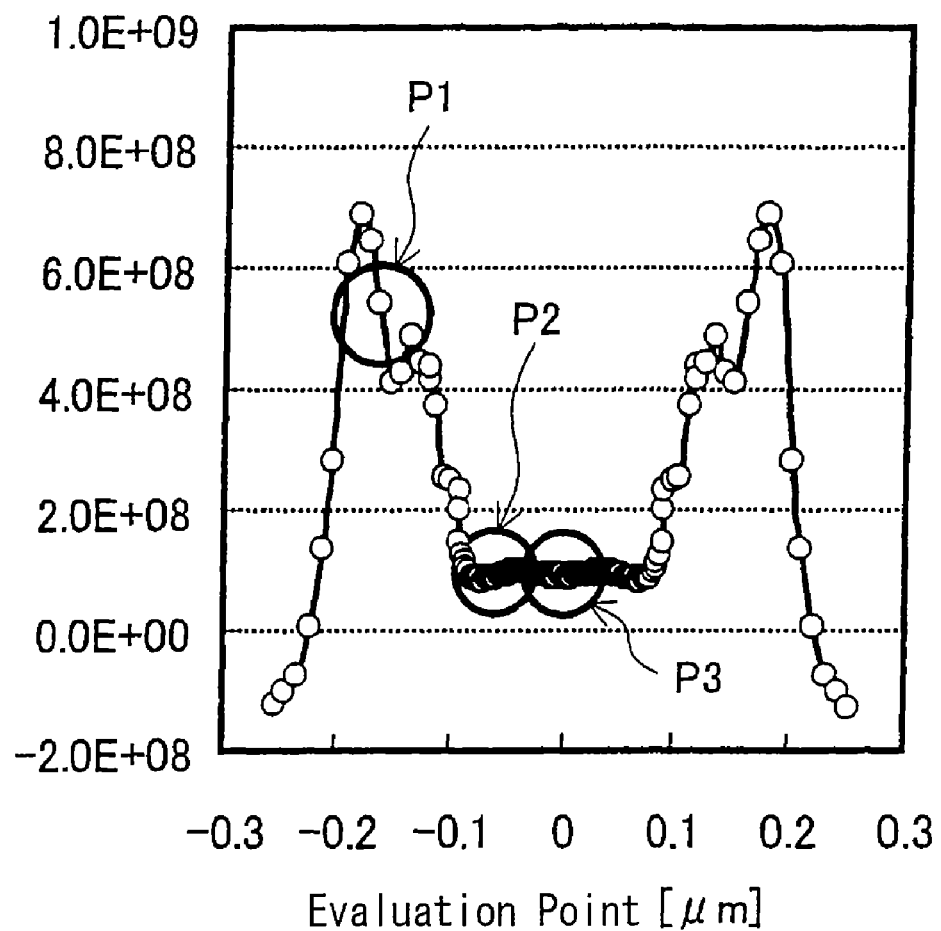

F I G. 5
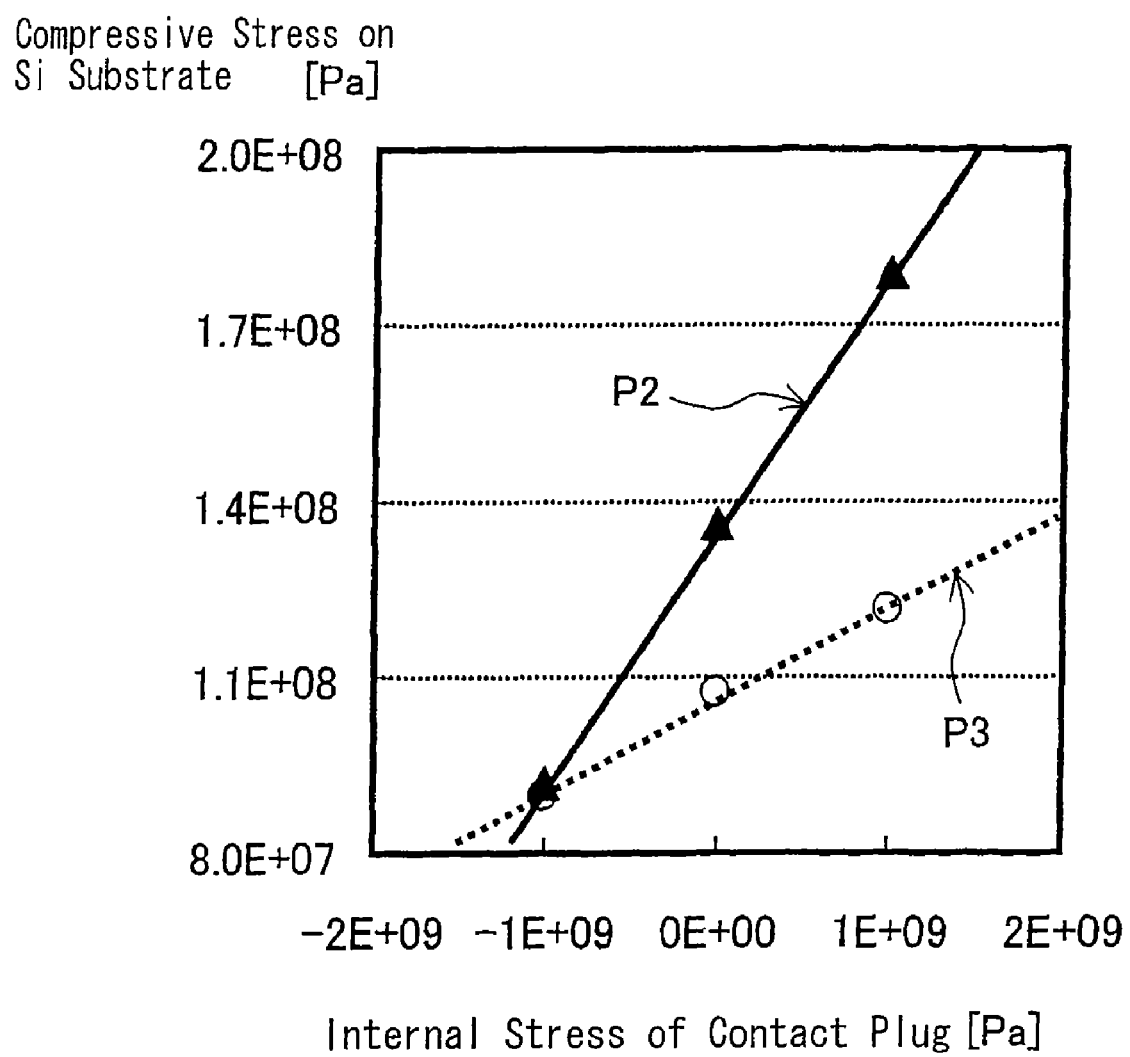

F I G. 9 A
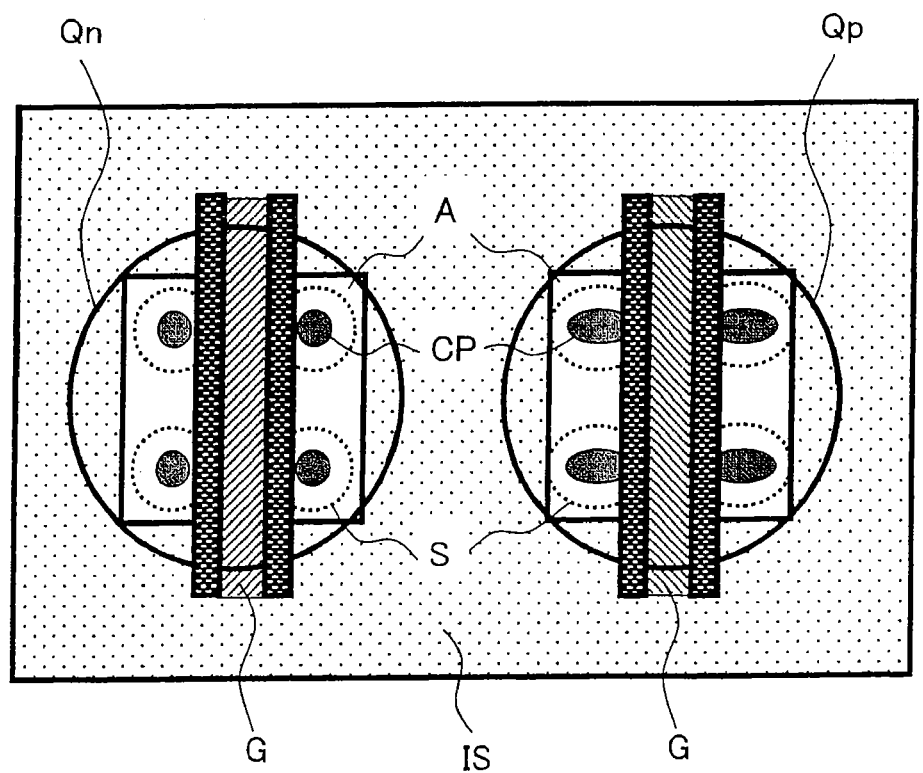
F I G. 9 B
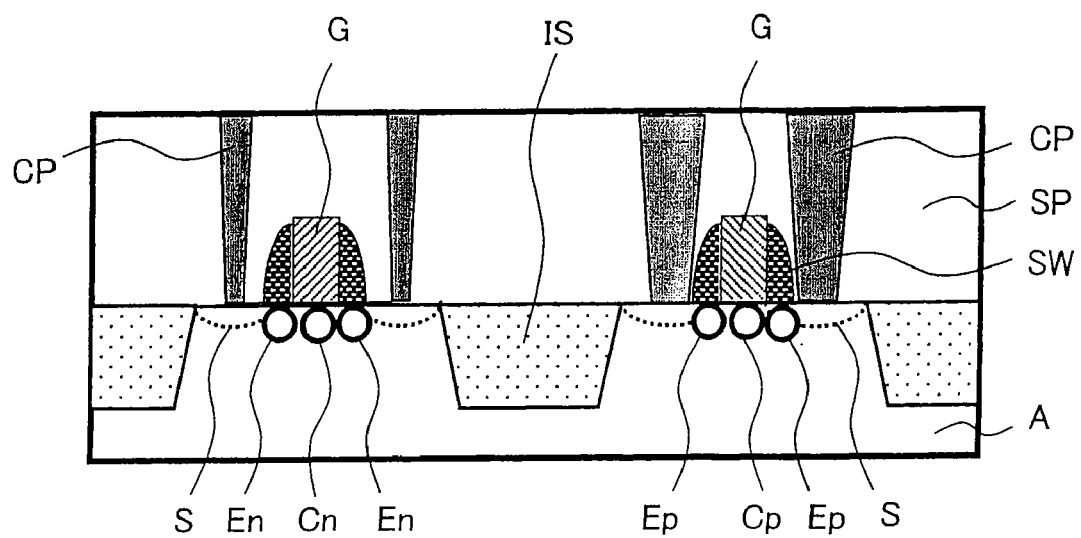

F I G. 1 0 A
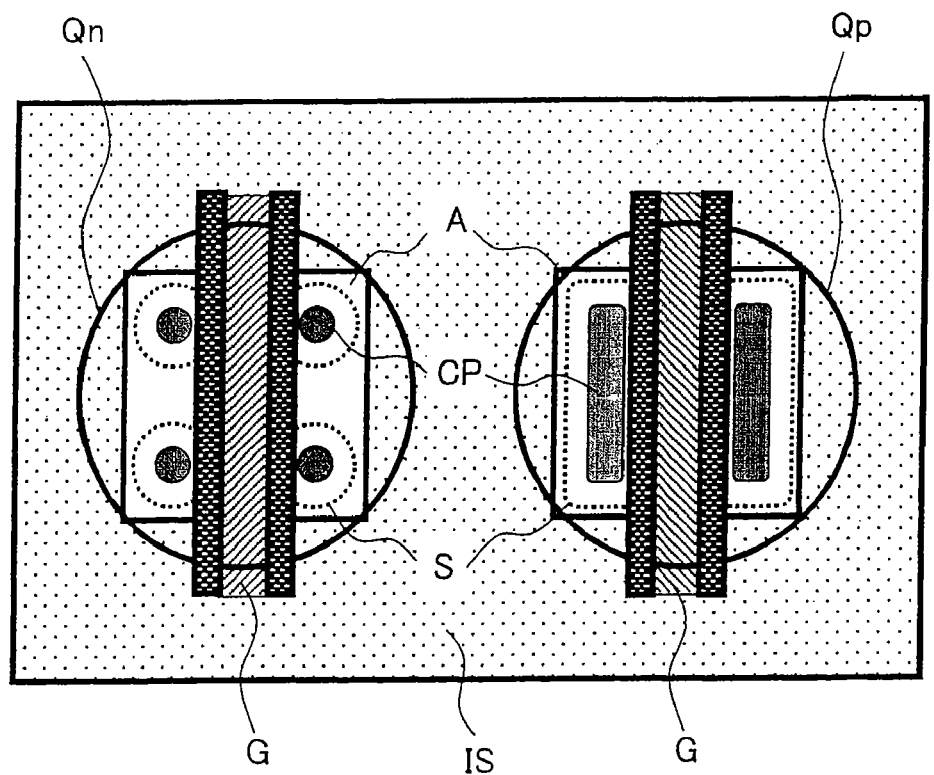
F I G. 1 0 B
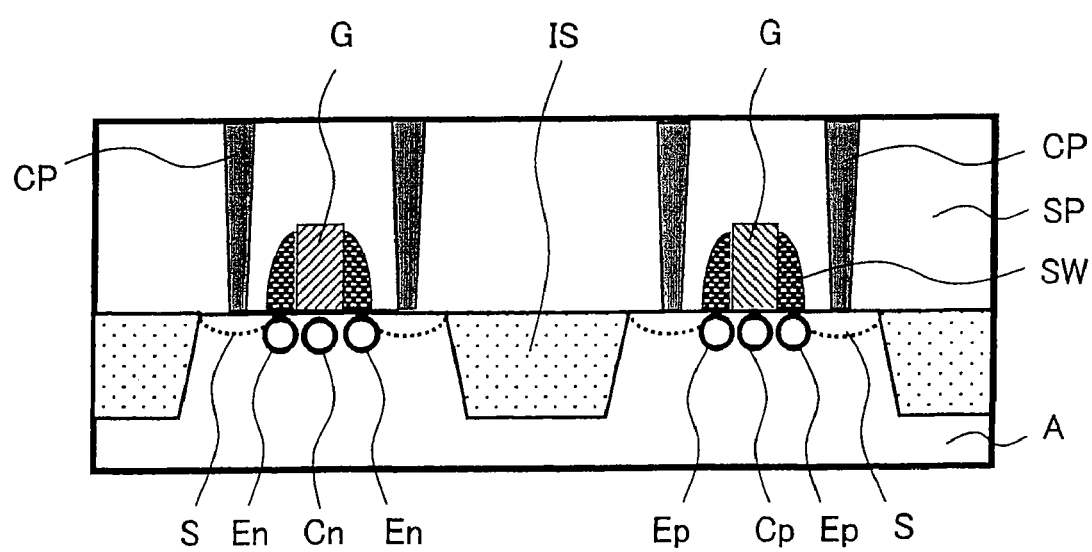

F I G. 1 1 A
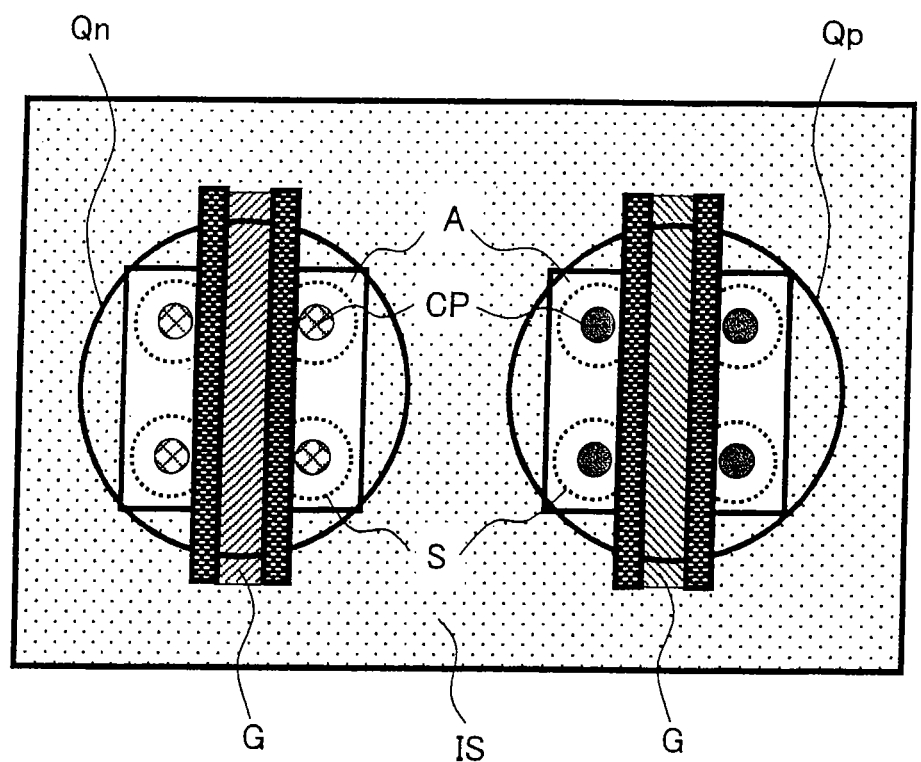
F I G. 1 1 B
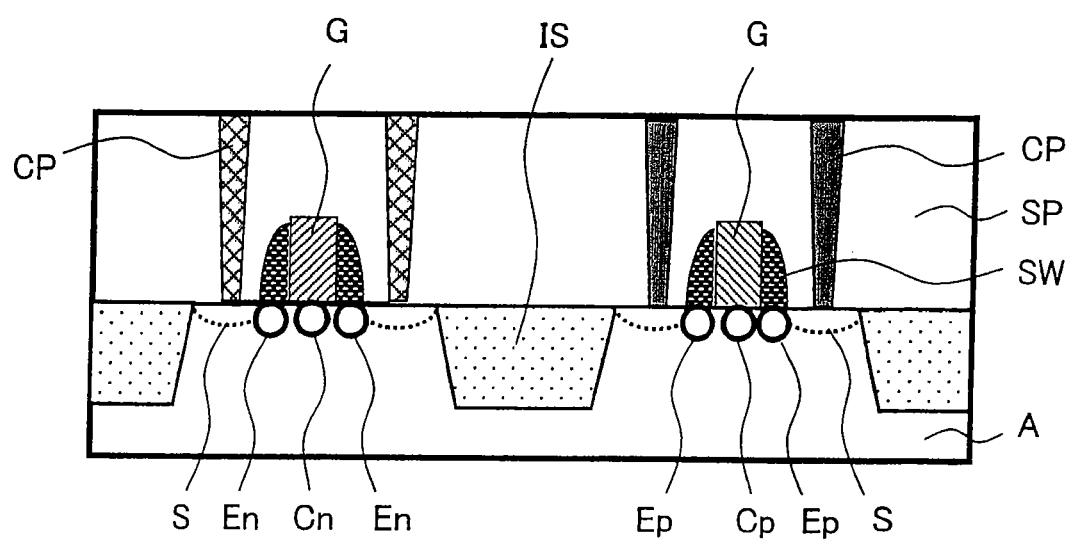

F I G. 1 4 A
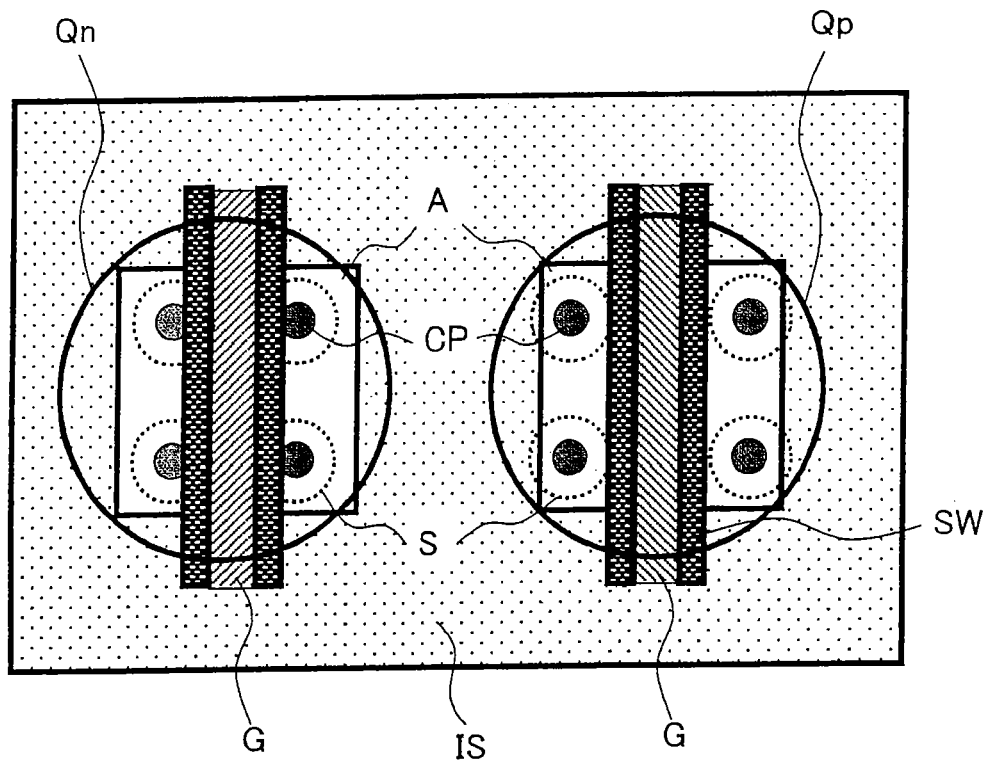
F I G. 1 4 B
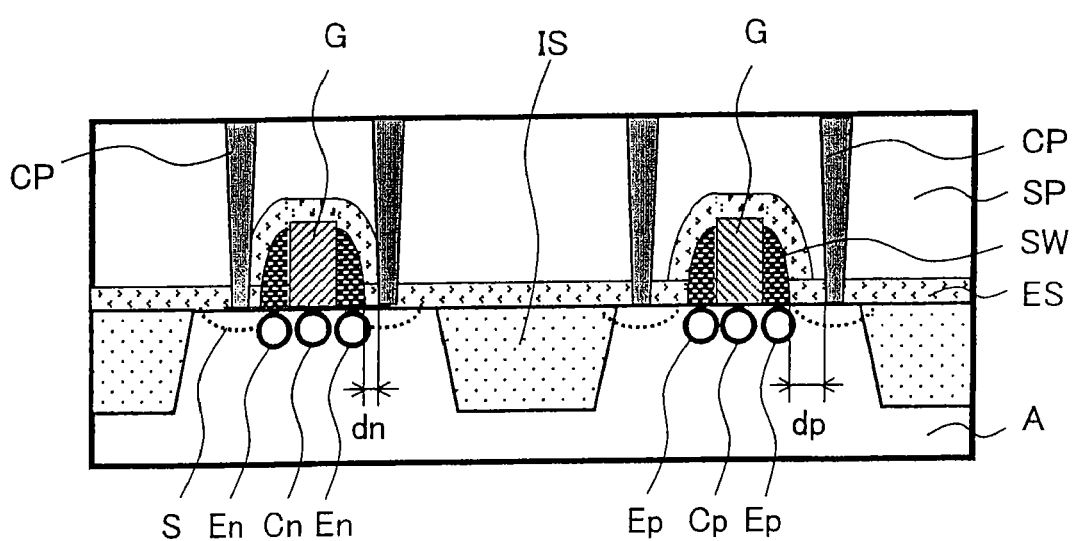

SEMICONDUCTOR DEVICE WITH AN IMPROVED OPERATING PROPERTY

RELATED APPLICATIONS

This application is a Divisional of U.S. application Ser. No. 11/258,034, filed Oct. 26, 2005 now abandoned, claiming priority of Japanese application No. 2004-366215, filed Dec. 17, 2004, the entire contents of each of which are hereby incorporated by reference.

BACKGROUND OF THE INVENTION

1. Field of the Invention

The present invention relates to a semiconductor device (LSI) and, more specifically, to a semiconductor device having MISFET (metal insulator semiconductor field effect transistor).

2. Description of the Related Art

A conventional semiconductor device will be described by referring to FIG. 15. This semiconductor device is disclosed in Japanese Patent Unexamined Publication 2001-332706, for example. In this semiconductor device, the threshold voltage or the drive current is controlled by adjusting at least one of isolation widths in the gate length direction of an element isolation part which includes (or surrounds) an active region where MISFET is formed.

In this semiconductor device, as shown in FIG. 15, isolation width La of the element isolation part is relatively narrowed so as to increase an influence of the stress imposed upon a channel region of MISFET (Q2). Thereby, change of the threshold voltage is made relatively significant. Further, isolation width Lb of the element isolation part is relatively widened so as to decrease an influence of the stress imposed upon a channel region of MISFET (Q4). Thereby, change of the threshold voltage is made relatively insignificant.

However, there has been an issue in the semiconductor device that the area of the element in the semiconductor device becomes large since the stress imposed on the transistor region is controlled by the active region width and the element isolation width. An increase of the area as described above will be a demerit in the future where micronization of the semiconductor device will be going on and more reduction of the area are to be achieved. Recently, micronization has been achieved and an influence upon the transistor property which is caused by the stress to the channel region has been increased. Thus, conventionally, as disclosed in "T. Ghani, et al., IEEE, S11, p 6, 2003", there is employed a method which improves the operating property of the transistor, e.g., the threshold voltage, drive current, by actively utilizing the stress which is generated during the process.

SUMMARY OF THE INVENTION

The main object of the present invention therefore is to improve the operating property of an n-channel transistor and p-channel transistor without increasing the area of the element.

In view of the stress imposed upon a transistor channel part by contact plugs (contact holes) which constitute a transistor or barrier metal of the contact plugs, the present invention comprises the following structure.

The semiconductor device according to the present invention comprises: an n-channel transistor forming region; a p-channel transistor forming region; contact plugs formed on both the n-channel transistor forming region and the p-channel transistor forming region; and an element isolation region which sections the n-channel transistor forming region and the p-channel transistor forming region. The stress which is generated in the n-channel transistor forming region due to the contact plugs thereof and the stress which is generated in the p-channel transistor forming region due to the contact plugs thereof differ from each other.

With the above-described structure, in the n-channel transistor forming region, the carrier mobility in the channel and extension regions is increased and the drive current property of the transistor is improved by reducing the compressive stress upon the channel and extension regions or by increasing the tensile stress thereupon. In the meantime, in the p-channel transistor forming region, the carrier mobility is increased and the drive current property of the transistor is improved by increasing the compressive stress or by decreasing the tensile stress.

In other words, in the n-channel transistor forming region, the compressive stress is in inverse proportion to the drive current, and the tensile stress is in direct proportion to the drive current. In the meantime, in the p-channel transistor forming region, the compressive stress is in direct proportion to the drive current, and the tensile stress is in inverse proportion to the drive current.

Based on such characteristics of the transistor forming regions, the extent of the stress which is generated due to the contact plugs is made different between the n-channel transistor forming region and the p-channel transistor forming region. Thereby, the drive current property is improved in both the n-channel transistor forming region and p-channel transistor forming region.

In the above-described structure, as the direction of the compressive stress and the tensile stress to be applied, it is preferable to be a direction that is in parallel to the channel.

In the above-described structure, as the structure for providing a difference between the stress in the n-channel transistor forming region and the stress in the p-channel transistor forming region, there area some preferable forms as will be described in the followings.

One of the forms provides a difference of the stress between both the n-channel and p-channel transistor forming regions by adjusting the number of contact plugs per unit area. This form pays attention to a character that the number of contact plugs is in direct proportion to the compressive stress and in inverse proportion to the tensile stress.

Specific description of this form is as follows. Based on the above-described characteristics of the transistor forming regions and contact plugs, in order to increase the drive current of the n-channel transistor forming region in the case where the stress generated due to the contact plugs is the compressive stress, the number of contact plugs may be reduced for decreasing the compressive stress. In the meantime, for increasing the drive current in the p-channel transistor forming region, inversely, the number of contact plugs may be increased so as to increase the compressive stress.

Thus, when the forming material of the contact plugs is a material with compressive stress, the number of the contact plugs per unit area of the n-channel transistor forming region is set relatively smaller with respect to that of a standard n-channel transistor, and the number of the contact plugs per unit area of the p-channel transistor forming region is set relatively larger with respect to that of a standard p-channel transistor.

With the above-described form, the drive current property can be improved in both the n-channel and p-channel transistor forming regions.

Based on the above-described characteristics of both the transistor forming regions and contact plugs, in order to increase the drive current of the n-channel transistor forming region in the case where the stress generated due to the contact plugs is the tensile stress, the number of contact plugs may be increased so as to increase the tensile stress. In the meantime, for increasing the drive current in the p-channel transistor forming region, the number of contact plugs may be reduced so as to decrease the tensile stress.

Thus, when the forming material of the contact plugs is a material with tensile stress, the number of the contact plugs per unit area of the n-channel transistor forming region is set relatively larger with respect to that of the standard n-channel transistor, and the number of the contact plugs per unit area of the p-channel transistor forming region is set relatively smaller with respect to that of the standard p-channel transistor.

With the above-described form, the drive current property can be improved in both the n-channel and p-channel transistor forming regions.

Another form provides a difference of the stress between both the n-channel and p-channel transistor forming regions by adjusting the shape of contact plugs. This form pays attention to a character that the diameter of the contact plugs is in direct proportion to the compressive stress and in inverse proportion to the tensile stress.

Specific description of this form is as follows. Based on the above-described characteristics of the transistor forming regions and contact plugs, in order to increase the drive current of the n-channel transistor forming region in the case where the stress generated due to the contact plugs is the compressive stress, the diameter of contact plugs may be reduced for decreasing the compressive stress. In the meantime, for increasing the drive current in the p-channel transistor forming region, inversely, the diameter of the contact plugs may be increased so as to increase the compressive stress.

Thus, when the forming material of the contact plugs is a material with compressive stress, the diameter of the contact plugs of the n-channel transistor forming region is set relatively smaller with respect to that of the standard n-channel transistor, and the diameter of the contact plugs of the p-channel transistor forming region is set relatively larger with respect to that of the standard p-channel transistor.

With the above-described form, the drive current property can be improved in both the n-channel and p-channel transistor forming regions.

Based on the above-described characteristics of the transistor forming regions and contact plugs, in order to increase the drive current of the n-channel transistor forming region in the case where the stress generated due to the contact plugs is the tensile stress, the diameter of the contact plugs may be increased so as to increase the tensile stress. In the meantime, for increasing the drive current in the p-channel transistor forming region, the diameter of the contact plugs may be reduced so as to decrease the tensile stress.

Thus, when the forming material of the contact plugs is a material with tensile stress, the diameter of the contact plugs of the n-channel transistor forming region is set relatively larger with respect to that of the standard n-channel transistor, and the diameter of the contact plugs of the p-channel transistor forming region is set relatively smaller with respect to that of the standard p-channel transistor.

With the above-described form, the drive current property can be improved in both the n-channel and p-channel transistor forming regions.

For providing a difference in the stress between the n-channel and p-channel transistor forming regions by adjusting the shape of the contact plugs, there is still another form. This form pays attention to a character that the size of the contact plugs is in direct proportion to the compressive stress and in inverse proportion to the tensile stress.

Specific description of this form is as follows. Based on the above-described characteristics of the transistor forming regions and contact plugs, in order to increase the drive current of the n-channel transistor forming region in the case where the stress generated due to the contact plugs is the compressive stress, the size of contact plugs may be reduced for decreasing the compressive stress. In the meantime, for increasing the drive current in the p-channel transistor forming region, inversely, the size of the contact plugs may be increased so as to increase the compressive stress.

Thus, when the forming material of the contact plugs is a material with compressive stress, the size of the contact plugs of the n-channel transistor forming region is set to be the minimum size that is defined by a design rule. Further, when comparing the dimensions thereof along direction of channel orientation of the contact plugs of both the n-channel transistor and the p-channel transistor, the contact plugs of the p-channel transistor forming region are relatively set larger with respect to the contact plugs of the n-channel transistor forming region.

With the above-described form, the drive current property can be improved in both the n-channel and p-channel transistor forming regions.

Based on the above-described characteristics of the transistor forming regions and contact plugs, in order to increase the drive current of the n-channel transistor forming region in the case where the stress generated due to the contact plugs is the tensile stress, the size of the contact plugs may be increased so as to increase the tensile stress. In the meantime, for increasing the drive current in the p-channel transistor forming region, the size of the contact plugs may be reduced so as to decrease the tensile stress.

Thus, when the forming material of the contact plugs is a material with tensile stress, the size of the contact plugs of the n-channel transistor forming region is set to be the minimum size that is defined by the design rule. Further, when comparing the dimensions thereof along direction of channel orientation of the contact plugs of both the n-channel transistor forming region and the p-channel transistor forming region, the contact plugs of the n-channel transistor forming region are relatively set larger with respect to the contact plugs of the p-channel transistor forming region.

With the above-described form, the drive current property can be improved in both the n-channel and p-channel transistor forming regions.

For providing a difference in the stress between the n-channel and p-channel transistor forming regions by changing the shape of the contact plugs, there is still another form.

This form pays attention to a character that the size of the contact plugs is in direct proportion to the compressive stress and in inverse proportion to the tensile stress. In this respect, this form is the same as the above-described form, however, the specific structure is different from that of the above-described form.

The specific description of this form is as follows. When the forming material of the contact plugs is a material with compressive stress, the size of the contact plugs of the n-channel transistor forming region is set to be the minimum size that is defined by the design rule. Further, when comparing the dimensions thereof along the longitudinal direction of the gate electrode of the contact plugs of both channel transistor forming regions, the contact plugs of the p-channel transistor forming region are relatively set larger with respect to the contact plugs of the n-channel transistor forming region.

With the above-described form, the drive current property can be improved in both the n-channel and p-channel transistor forming regions.

Further, when the forming material of the contact plugs is a material with tensile stress, the size of the contact plugs of the n-channel transistor forming region is set to be the minimum size that is defined by the design rule. Further, when comparing the dimensions thereof along the longitudinal direction of the gate electrode of the contact plugs of both channel transistor forming regions, the contact plugs of the n-channel transistor forming region are relatively set larger with respect to the contact plugs of the p-channel transistor forming region.

With the above-described form, the drive current property can be improved in both the n-channel and p-channel transistor forming regions.

As still another form, there is a form which provides a difference in the stress between the n-channel and p-channel transistor forming regions by adjusting the material for forming the contact plugs. This form pays attention to the fact that there is a material which is best suited for the forming material for the contact plugs of both the n-channel and p-channel transistor forming regions in terms of the drive current property.

The specific description of this form is as follows. A material with tensile strength is selectively used as the forming material for the contact plugs of the n-channel transistor forming region, and a material with compressive stress (for example, W, Ti, Ta, Co, $CoSi_2$, etc) is selectively used as the forming material for the contact plugs of the p-channel transistor forming region.

With the above-described structure, in the n-channel transistor forming region, the tensile stress for the channel and extension regions is increased. Thus, the carrier mobility in the channel and extension regions is increased. Further, in the p-channel transistor forming region, the compressive stress is increased thus increasing the carrier mobility. Thereby, the drive current property can be improved in both the n-channel and p-channel transistor forming regions.

As still another form, there is a form which provides a difference in the stress between the n-channel and p-channel transistor forming regions by adjusting the material for forming the barrier metal. This form pays attention to the fact that there is a material which is best suited for the forming material for the barrier metal of both the n-channel and p-channel transistor forming regions in terms of the drive current property. The barrier metal is a structure which is widely used in a semiconductor device for improving the adhesiveness between the contact plugs and the substrate.

The specific description of this form is as follows. A material with tensile stress is selectively used for the barrier metal of the n-channel transistor forming region, and a material with compressive stress (for example, Ti, Ta, etc) is selectively used for the barrier metal of the p-channel transistor forming region.

With the above-described form, the tensile stress in the n-channel transistor forming region is increased due to the barrier metal having the tensile stress. Further, the compressive stress in the p-channel transistor forming region is increased due to the barrier metal having the compressive stress. With this, the carrier mobility is increased in each of the transistor forming regions. Thereby, the drive current property can be improved in both the n-channel and p-channel transistor forming regions.

As still another form, there is a form which provides a difference in the stress between the n-channel and p-channel transistor forming regions by adjusting the shape of the barrier metal. This form pays attention to the fact that there is a shape which is best suited for the shape of the barrier metal of the contact plugs of both the n-channel and p-channel transistor forming regions in terms of the drive current property.

The specific description of this form is as follows. First, described is the case where the forming material of the barrier metal is a material with compressive stress. In this case, the film thickness of the barrier metal in the n-channel transistor forming region is set relatively thinner with respect to that of the standard n-channel transistor, and the film thickness of the barrier metal in the p-channel transistor forming region is set relatively thicker with respect to that of the standard p-channel transistor.

With the above-described form, the compressive stress in the n-channel transistor forming region is decreased by reducing the film thickness of the barrier metal. Further, the compressive stress in the p-channel transistor forming region is increased by increasing the film thickness of the barrier metal. Thereby, the carrier mobility is increased in each of the transistor forming regions so that the drive current property can be improved.

Next, described is the case where the forming material of the barrier metal is a material with tensile stress. In this case, the film thickness of the barrier metal in the n-channel transistor forming region is set relatively thicker with respect to that of the standard n-channel transistor, and the film thickness of the barrier metal in the p-channel transistor forming region is set relatively thinner with respect to that of the standard p-channel transistor.

With the above-described form, the tensile stress in the n-channel transistor forming region is increased by reducing the film thickness of the barrier metal. Further, the tensile stress in the p-channel transistor forming region is decreased by reducing the film thickness of the barrier metal. Thereby, the carrier mobility is increased in each of the transistor forming regions so that the drive current property can be improved.

As still another form, there is a form which provides a difference in the stress between the n-channel and p-channel transistor forming regions by adjusting the height of the barrier metal. This form pays attention to the fact that there is a height which is best suited for the respective barrier metal of the contact plugs of both n-channel and p-channel transistor forming regions in terms of the drive current property.

The specific description of this form is as follows. First, described is the case where the forming material of the contact plugs is a material with compressive stress. In this case, the height of the barrier metal of the n-channel transistor forming region is set relatively smaller with respect to that of the standard n-channel transistor, and the height of the barrier metal of the p-channel transistor forming region is set relatively larger with respect to that of the standard p-channel transistor.

With the above-described form, the compressive stress in the n-channel transistor forming region is decreased by decreasing the height of the barrier metal. Further, the compressive stress in the p-channel transistor forming region is increased by increasing the height of the barrier metal. Thereby, the carrier mobility is increased in each of the transistor forming regions so that the drive current property can be improved.

Next, described is the case where the forming material of the contact plugs is a material with tensile stress. In this case, the height of the barrier metal of the n-channel transistor forming region is set relatively larger with respect to that of the standard n-channel transistor, and the height of the barrier metal of the p-channel transistor forming region is set relatively smaller with respect to that of the standard n-channel transistor.

With the above-described form, the tensile stress in the n-channel transistor forming region is increased by increasing the height of the barrier metal. Further, the tensile stress in the p-channel transistor forming region is decreased by decreasing the height of the barrier metal. Thereby, the carrier mobility is increased in each of the transistor forming regions so that the drive current property can be improved.

As still another form, there is a form which provides a difference in the stress between the n-channel and p-channel transistor forming regions by adjusting the isolated distance between the contact plugs and the gate electrode. This form pays attention to the fact that there is a distance which is best suited for the distance between the contact plugs and the gate electrode for both the n-channel and p-channel transistor forming regions in terms of the drive current property.

The specific description of this form is as follows. First, described is the case where the forming material of the contact plugs is a material with compressive stress. In this case, the isolated distance between the contact plugs of the n-channel transistor forming region and the gate electrode is set relatively smaller with respect to that of the standard n-channel transistor, and the isolated distance between the contact plugs of the p-channel transistor forming region and the gate electrode is set relatively narrower with respect to that of the standard p-channel transistor.

Alternatively, the isolated distance between the contact plugs of the n-channel transistor forming region and the gate electrode is set to be the widest distance that is defined by the design rule. Further, the isolated distance between the contact plugs of the p-channel transistor forming region and the gate electrode is set to be the narrowest distance that is defined by the design rule.

With the above-described form, the compressive stress in the n-channel transistor forming region is decreased by setting the isolated distance between the contact plugs and the gate electrode to be the widest distance that is defined by the design rule. Furthermore, the compressive stress in the p-channel transistor forming region is increased by setting the isolated distance between the contact plugs and the gate electrode to be the narrowest distance that is defined by the design rule. Thereby, the carrier mobility is increased in each of the transistor forming regions so that the drive current property can be improved.

Next, described is the case where the forming material of the contact plugs is a material with tensile stress. In this case, the isolated distance between the contact plugs of the n-channel transistor forming region and the gate electrode is set relatively smaller with respect to that of the standard n-channel transistor. Further, the isolated distance between the contact plugs of the p-channel transistor forming region and the gate electrode is set relatively wider with respect to that of the standard n-channel transistor.

Alternatively, the isolated distance between the contact plugs of the n-channel transistor forming region and the gate electrode is set to be the narrowest distance that is defined by the design rule, and the isolated distance between the contact plugs of the p-channel transistor forming region and the gate electrode is set to be the widest distance that is defined by the design rule.

With the above-described form, the tensile stress in the n-channel transistor forming region is increased by setting the isolated distance between the contact plugs and the gate electrode to be the narrowest distance that is defined by the design rule. Furthermore, the tensile stress in the p-channel transistor forming region is decreased by setting the isolated distance between the contact plugs and the gate electrode to be the widest distance that is defined by the design rule. Thereby, the carrier mobility is increased in each of the transistor forming regions so that the drive current property can be improved.

With the present invention, it is possible to improve the drive current property in both the n-channel transistor forming region and the p-channel transistor forming region without changing the dimensions of each active region and element isolation region by providing a difference between the stress in the n-channel transistor forming region and the stress in the p-channel transistor forming region, each of which is generated due to the contact plugs thereof.

The present invention is effective for a semiconductor device and the like in which the operating property of MISFET can be improved.

BRIEF DESCRIPTION OF THE DRAWINGS

Other objects of the present invention will become clear from the following description of the preferred embodiments and the appended claims. Those skilled in the art will appreciate that there are many other advantages of the present invention possible by embodying the present invention.

FIG. 3 is a cross section of MISFET which is evaluated by performing stress simulation for describing the principle of the present invention;

FIG. 4 is a graph for showing the evaluation-point dependability of the stress generated by the contact plugs, which is the evaluation result of the simulation of FIG. 3;

FIG. 5 is a graph for showing the evaluation result of the simulation of FIG. 3, i.e., the dependability of the stress that is generated by the contact plugs right under the sidewall and right under the gate electrode on the internal stress of the contact plugs;

FIG. 9A is an enlarged plan view of a semiconductor device according to a third embodiment of the present invention;

FIG. 9B is a cross section of the semiconductor device according to the third embodiment of the present invention;

FIG. 10A is an enlarged plan view of a semiconductor device according to a fourth embodiment of the present invention;

FIG. 10B is a cross section of the semiconductor device according to the fourth embodiment of the present invention;

FIG. 11A is an enlarged plan view of a semiconductor device according to a fifth embodiment of the present invention;

FIG. 11B is a cross section of the semiconductor device according to the fifth embodiment of the present invention;

FIG. 14A is an enlarged plan view of a semiconductor device according to an eighth embodiment of the present invention;

FIG. 14B is a cross section of the semiconductor device according to the eighth embodiment of the present invention; and FIG. 15 is an enlarged plan view of a conventional semiconductor device including an active region, an element isolation region, and a gate electrode.

DETAILED DESCRIPTION OF THE DRAWINGS

Preferred embodiments of the present invention will be described hereinafter by referring to the accompanying drawings.

(Principle of the Present Invention)

Figure 1:
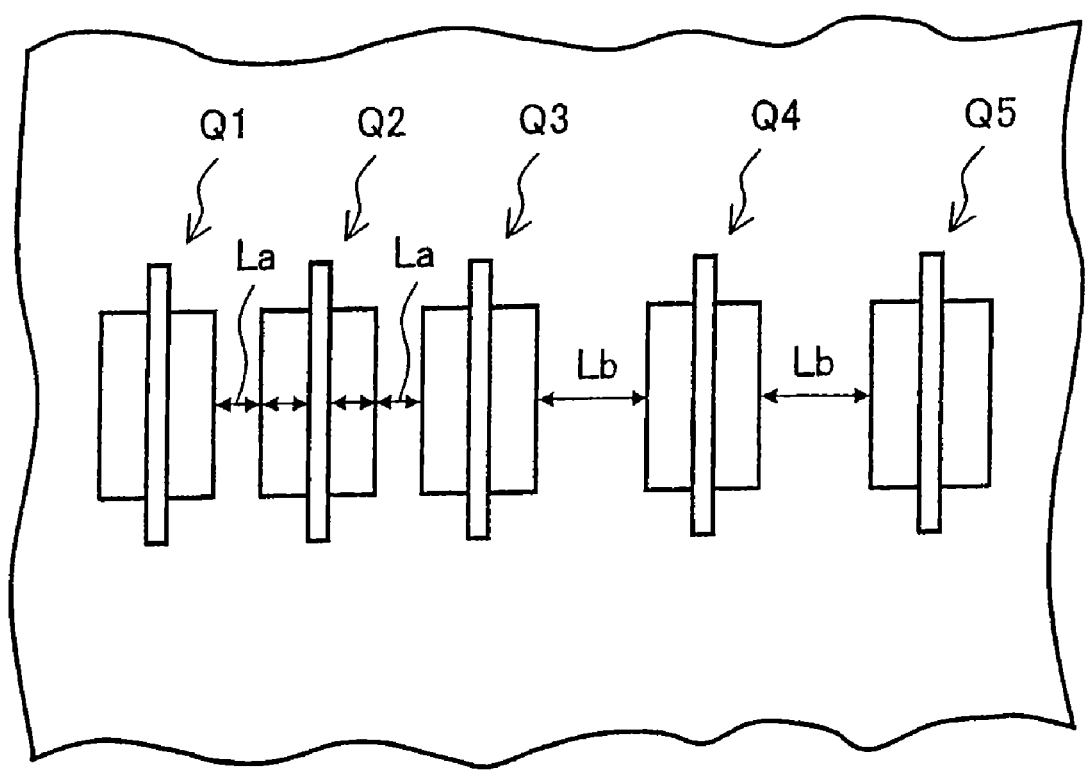
FIG. 1A is a schematic plan view of a semiconductor device according to embodiments of the present invention.
FIG. 1B is a fragmentary enlarged plan view of the semiconductor device according to the embodiments of the present invention.

First, the principle of the present invention will be described by referring to the accompanying drawings. FIG. 1A shows a schematic plan structure of a semiconductor device according to the embodiments of the present invention. As shown in FIG. 1A, a semiconductor device 1 of a first embodiment is formed on a semiconductor substrate 10 made of silicon, for example. The semiconductor device 1 comprises an encoder part 11 having MPEG (motion picture experts group) encoding function, a ROM part 12 having ROM (read only memory) function, a memory part 13, and an I/O part 14 which manages input and output (I/O) to/from outside.

FIG. 1B shows an enlarged view of arbitrary area 13 in the ROM section 12 shown in FIG. 1A. As shown in FIG. 1B, a region 12a is sectioned into an element isolation (shallow trench isolation: STI) region 20. Reference numeral 21 is a dummy active region and 22 is a part of peripheral circuit.

Figure 2:
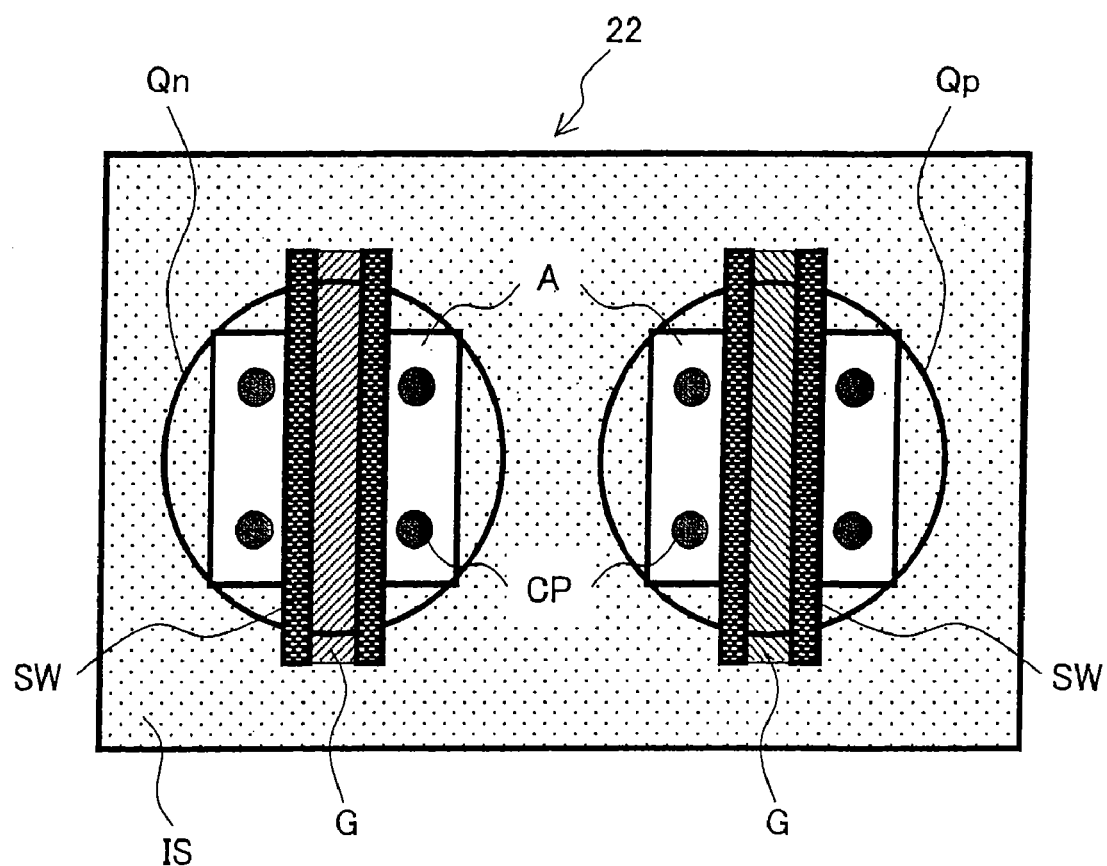
FIG. 2 is a plan view of a typical complementary MISFET (CMOS), which is an enlarged view of a part of region shown in FIG. 1B.

FIG. 2 is an enlarged view of the region 22 shown in FIG. 1B. As shown in FIG. 2, in the region 22 shown as an enlarged view, n-channel transistor Qn and p-channel transistor Qp which are sectioned in the element isolation region 22 are disposed. Each transistor has active regions A, a gate electrode G, sidewalls SW, and contact plugs CP.

For example, one of the factors which change the operating property of the n-channel transistor Qn and the p-channel transistor Qp is considered to be caused by an influence of the stress imposed upon each active region A from each contact plug CP.

The stress upon each active region A imposed from the contact plugs CP changes depending on the number of contact plugs CP, the shape, the material, the isolated space between the sidewall SW and the contact plug CP, and the process condition.

The present invention pays attention to changes in the stress caused by the number of contact plugs CP, the shape, the material, the isolated space between the sidewall SW and the contact plug CP, but not changes in the stress by the process condition.

For verifying the above-mentioned aspects, the result of simulation for evaluating the stress imposed upon the active region A from the contact plug CP will be described by referring to the drawing. FIG. 3 shows the cross sectional structure by which the simulation evaluation was carried out, and the result of the stress evaluation thereof.

Evaluation was carried out on assumption that a polysilicon gate electrode with the gate length of 70 nm was formed on a silicon substrate Su, and a transistor was formed with SiN sidewall SW, an interlayer film SP, contact plugs CP, and an SiN etch-stop film ES. Reference numerals P1, P2, P3 show typical stress evaluation points and, respectively, P1 is a point right under the contact plug, P2 is a point right under the sidewall, and P3 is a point right under the gate electrode. Further, d shows an isolated distance between the contact plug CP and the sidewall SW.

As the isolated distance d in the present invention, it is substantially appropriate to define it as the isolated distance between the contact plug CP and the gate electrode G. However, in that case, there is an issue of short-circuit and the like generated between the contact plug CP and the gate electrode G so that measurement becomes difficult. Thus, in the present invention, instead of the isolated distance between the contact plug CP and the gate electrode G, the isolated distance between the contact plug CP and the sidewall SW, which is equivalent to the isolated distance between the contact plug CP and the gate electrode G, is used for measurement as the substantial isolated distance between the contact plug CP and the gate electrode G.

FIG. 4 shows the result of evaluation on the stress at the depth of about 5 nm from the top surface of the silicon substrate Su by simulation. By observing each of the evaluation points P1, P2, P3 in FIG. 4, it can be seen that the stress is applied on the silicon substrate Su by the contact plugs CP.

FIG. 5 shows how the stress caused by the contact plugs CP changes by the internal stress of the contact plugs CP. FIG. 5 shows the evaluation result of the stress simulation at the point P2 right under the sidewall and the point P3 right under the gate electrode when the internal stress of the contact plug CP was changed from −1 GPa, 0 GPa, and +1 GPa.

As shown in this evaluation result, in accordance with the change of the internal stress of the contact plugs, the stress at the point P2 right under the sidewall changes about 90 Mpa, and the stress at the point P3 right under the gate electrode G changes about 30 MPa.

Figure 6:
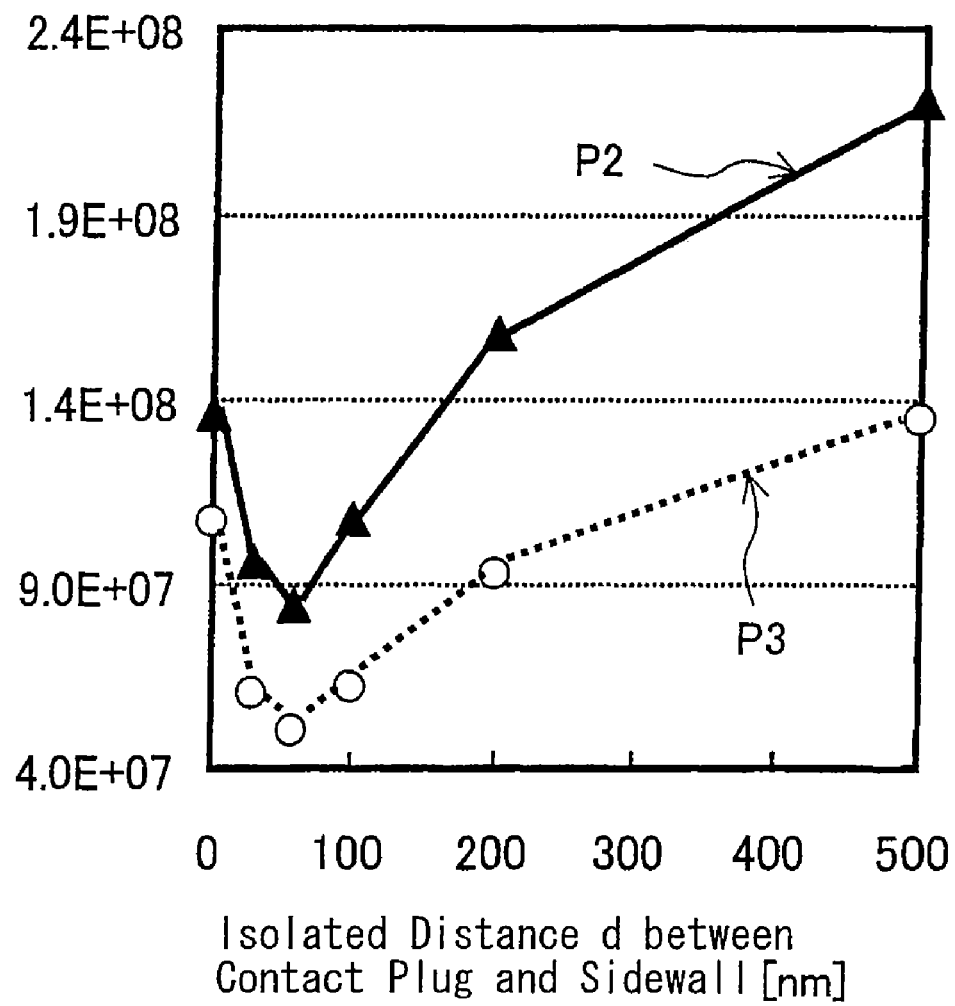
FIG. 6 is a graph for describing information of the present invention other than that shown in FIG. 3, which shows the dependability of the stress that is generated by the contact plugs on the distance between the contact plugs and the sidewall.

FIG. 6 shows the result of the evaluation by simulation performed on the stress change caused by the isolated distance d between the contact plug CP and the sidewall SW. FIG. 6 shows the result of simulation which was performed on assumption that the internal stress was 0 GPa.

As shown in FIG. 6, in accordance with the change of the isolated distance d between the contact plug CP and the sidewall SW, the stress at the point P2 right under the sidewall changes about 140 MPa at the most, and the stress at the point P3 right under the gate electrode changes about 85 MPa at the most.

Further, as shown in FIG. 6, the shorter the isolated distance d becomes, the larger the influence of the stress caused by the contact plug CP becomes. Thus, the compressive stress at the points P2 and P3 increases. In the meantime, it can be seen that, the longer the isolated distance d becomes, the larger the influence of the stress caused by the SiN etch-step film ES becomes. The inventors of the present invention have found the following information from the stress evaluation result shown in FIG. 3, FIG. 4, FIG. 5, and FIG. 6.

The stress applied on the active region A changes by the presence of the contact plugs CP.

The stress at the point P2 right under the sidewall and at the point P3 right under the gate electrode changes depending on the isolated distance d between the contact plug CP and the sidewall SW.

In so-called 0.13 μm process of a semiconductor manufacturing method, it is generally known that an increase of about 150 MPa in the compressive stress decreases the drive current by about 5% in the n-channel transistor.

In the present invention, the following embodiments will be described with the consideration of the evaluation results shown in FIG. 3, FIG. 4, FIG. 5, and FIG. 6. In the description provided below, the comparative target of stress increase and/or decrease is the peripheral circuit shown in FIG. 2.

In the first to seventh embodiments, the structures will be described on assumption that the stress applied on the active region due to the contact plugs is the compressive stress, and the distance from the center of the contact plug to the center of the gate electrode is constant.

In an eighth embodiment, description will be provided on assumption that the stress applied on the active region due to the contact plugs and etch-stop film is the compressive stress.

First Embodiment

Figure 7A:
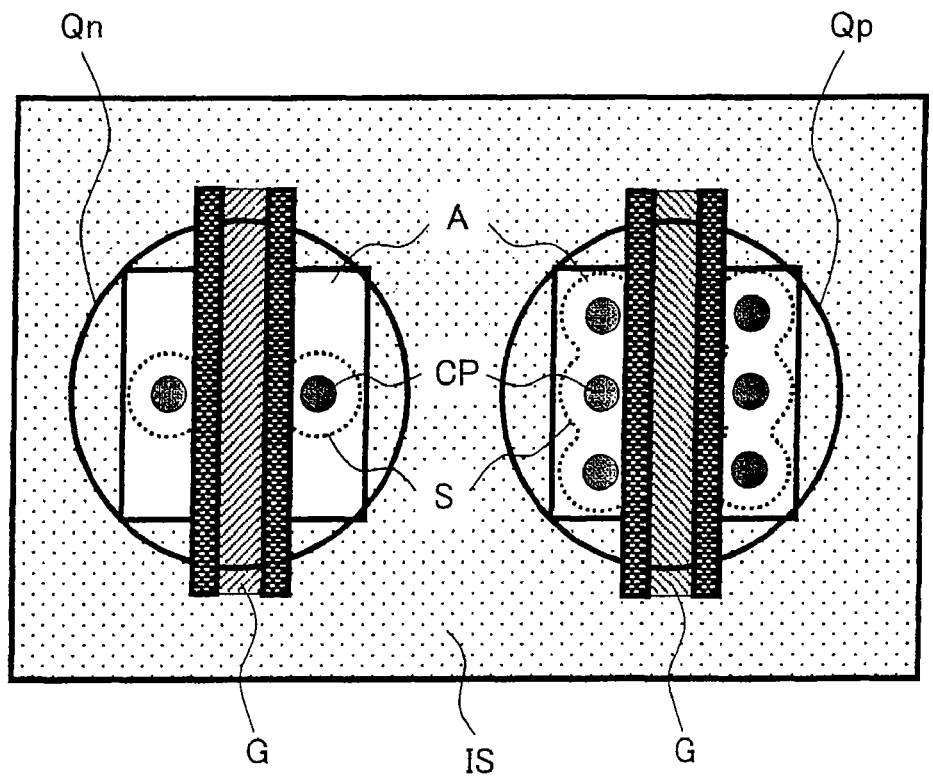
FIG. 7A is an enlarged plan view of a semiconductor device according to a first embodiment of the present invention.
Figure 7B:
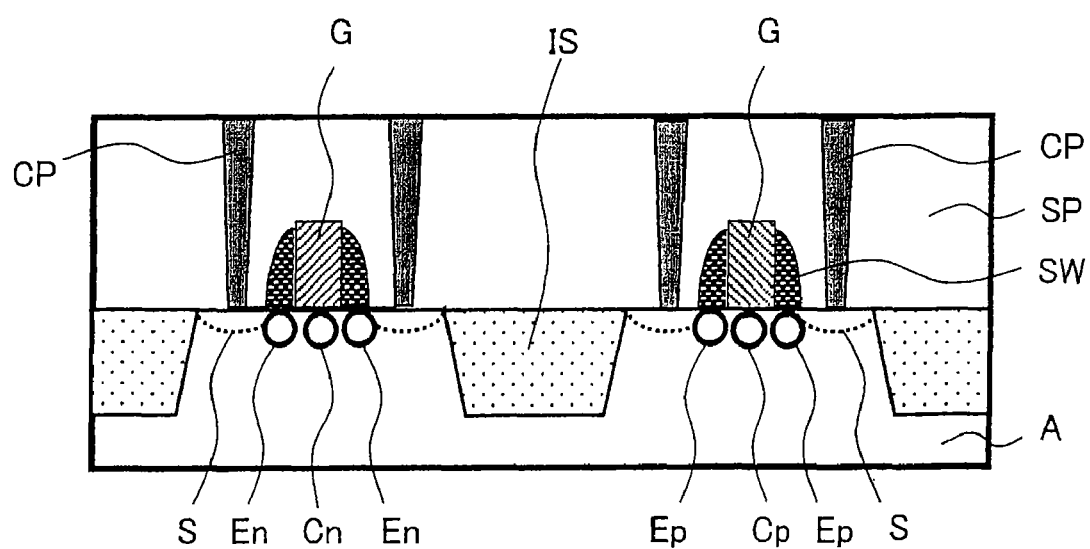
FIG. 7B is a cross section of the semiconductor device according to the first embodiment of the present invention.

The first embodiment of the present invention will be described hereinafter by referring to the drawings. FIG. 7A is an enlarged plan view of an n-channel transistor and a p-channel transistor of a semiconductor device according to the first embodiment of the present invention, which include, respectively, active regions, an element isolation region, a gate electrode, sidewalls, and contact plugs. FIG. 7B is a cross section of the n-channel transistor and the p-channel transistor, which is taken along the center of the contact plug at a region corresponding to FIG. 7A and is in parallel to the channel direction.

As described above, in the semiconductor device, the operating property of the transistor is determined under the state where stress is applied on extension regions En, Ep and channel regions Cn, Cp from the element isolation region IS, Gate electrode G, sidewalls SW, contact plugs CP, and the interlayer film SP. Therefore, in accordance with the ongoing micronization, a method for improving the transistor property by utilizing the above-described stress has drawn an attention. At this time, the drive current increases when the tensile stress is applied on the extension region En and the channel region Cn on the n-channel transistor Qn side, and the drive current increases when the tensile stress is applied on the extension region Ep and the channel region Cp on the n-channel transistor Qp side.

Thus, in the first embodiment, the number of the contact plugs CP of the n-channel transistor Qn is relatively decreased with respect to that of the standard n-channel transistor shown in FIG. 2. This narrows a range S where the contact plug CP gives an influence of the compressive stress on the extension region En and the channel region Cn. By narrowing the stress range S where the compressive stress is applied, the range where the drive current decreases becomes narrowed. Therefore, the drive current of the n-channel transistor Qn according to the first embodiment is increased compared to that of the standard n-channel transistor.

Further, the number of the contact plugs CP of the p-channel transistor Qp is relatively increased with respect to that of the standard p-channel transistor shown in FIG. 2 so as to widen a range S where the contact plug CP gives an influence of the compressive stress on the extension region En and the channel region Cn. By widening the range S where the compressive stress is applied, the range where the drive current increases becomes widened. Therefore, the drive current of the p-channel transistor Qp according to this embodiment is increased compared to that of the standard p-channel transistor.

With this, the drive current of both the n-channel transistor Qn and the p-channel transistor Qp can be increased without changing the dimensions of the active region A and the element isolation region IS.

When the contact plugs CP of the n-channel transistor forming region Qn and the contact plugs CP of the p-channel transistor forming region Qp are formed with a material with tensile stress, they may be constituted as follows. That is, the number of the contact plugs per unit area of the n-channel transistor Qn is relatively increased with respect to the number of the contact plugs per unit area of the standard n-channel transistor shown in FIG. 2. Furthermore, the number of the contact plugs per unit area of the p-channel transistor Qp is relatively decreased with respect to the number of the contact plugs per unit area of the standard p-channel transistor shown in FIG. 2. With this, the effect which is similar to the above-described effect can be achieved.

Second Embodiment

Figure 8A:
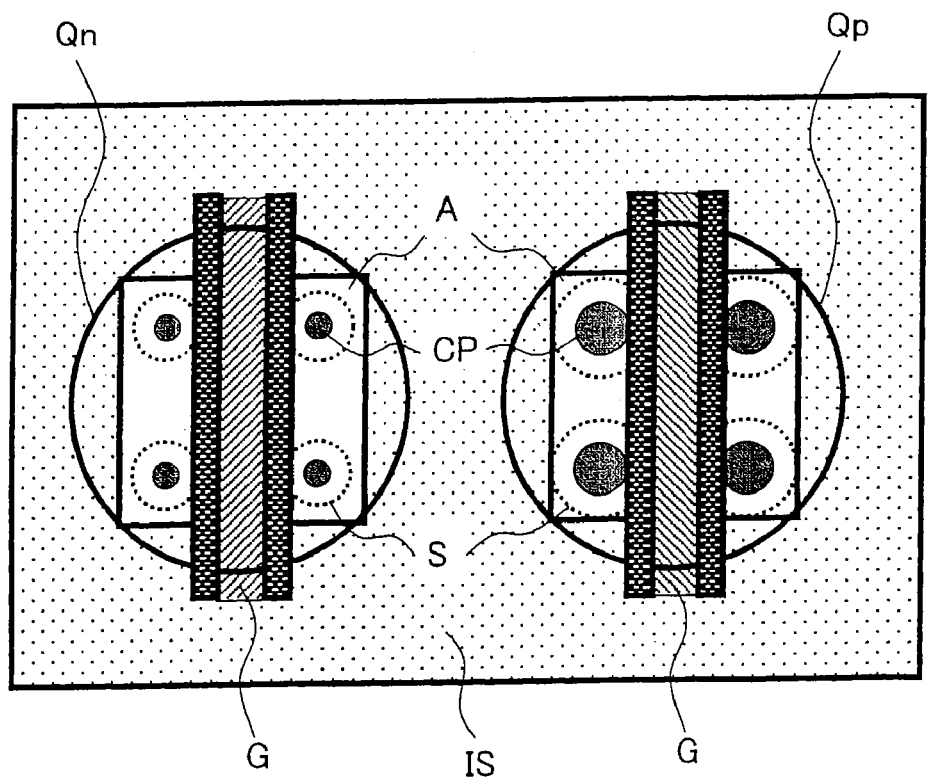
FIG. 8A is an enlarged plan view of a semiconductor device according to a second embodiment of the present invention.
Figure 8B:
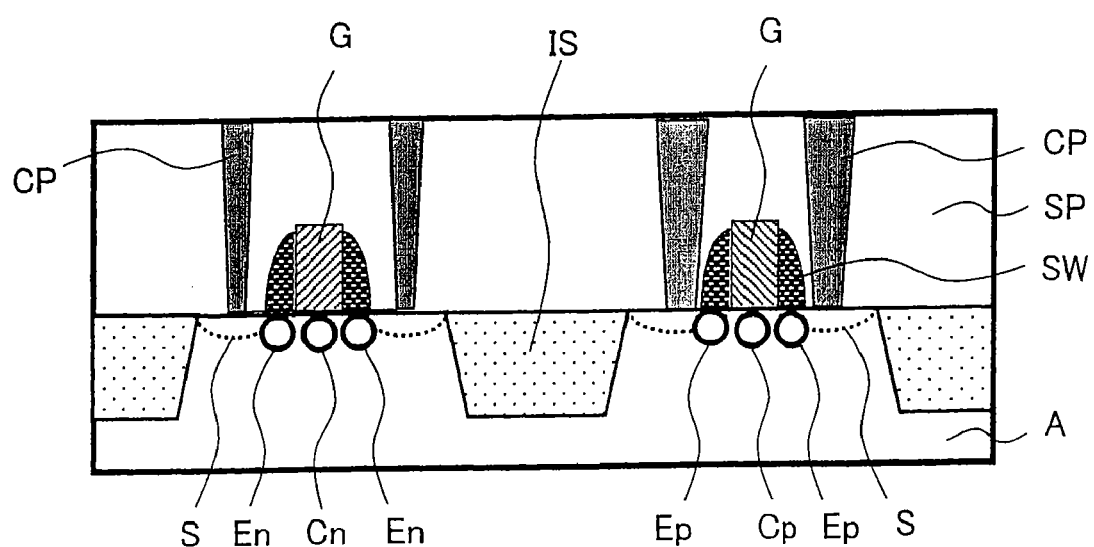
FIG. 8B is a cross section of the semiconductor device according to the second embodiment of the present invention.

FIG. 8A is an enlarged plan view of a semiconductor device according to the second embodiment of the present invention. FIG. 8B is the cross section thereof.

As described above, in the semiconductor device, the operating property of the transistor is determined under the state where stress is applied on extension regions En, Ep and channel regions Cn, Cp from the element isolation region IS, gate electrode G, sidewalls SW, contact plugs CP, and the interlayer film SP.

In the second embodiment, the diameter of the contact plug CP of the n-channel transistor Qn is relatively decreased with respect to that of the standard n-channel transistor. This decreases the compressive stress on the extension region En and the channel region Cn applied by the contact plugs CP. By decreasing the compressive stress upon the extension region En and the channel region Cn, the drive current of the n-channel transistor Qn according to the embodiment is increased compared to that of the standard n-channel transistor.

Further, the diameter of the contact plug CP of the p-channel transistor Qp is relatively increased with respect to that of the standard p-channel transistor. This increases the compressive stress on the extension region Ep and the channel region Cp applied by the contact plugs CP. By increasing the compressive stress upon the extension region Ep and the channel region Cp, the drive current of the p-channel transistor Qp according to the second embodiment is increased compared to that of the standard p-channel transistor.

With this, in the second embodiment, the drive current of both the n-channel transistor Qn and the p-channel transistor Qp can be increased without changing the dimensions of the active region A and the element isolation region IS.

In the case where the stress applied on the active region by the contact plugs is the tensile stress, they may be formed as follows. That is, the diameter of the contact plug CP of the n-channel transistor Qn is relatively increased with respect to that of the standard n-channel transistor shown in FIG. 2, and the diameter of the contact plug CP of the p-channel transistor Qp is relatively decreased with respect to that of the standard p-channel transistor shown in FIG. 2. With this, the effect which is similar to the above-described effect can be achieved.

Third Embodiment

FIG. 9A is an enlarged view of a semiconductor device according to the third embodiment of the present invention. FIG. 9B is the cross section thereof.

In the third embodiment, the size of the contact plug CP of the n-channel transistor Qn is set to have the minimum dimension that is defined by the design rule. With this, the compressive stress applied to the extension region En and the channel region Cn by the contact plugs CP becomes the minimum value. Since the compressive stress upon the extension region En and the channel region Cn becomes the minimum, decrease of the drive current in the n-channel transistor Qn becomes the minimum.

Further, comparing the dimensions of the contact plugs CP of both channel transistors Qn and Qp along the direction of the channel orientation (lateral direction in FIG. 9A), in the third embodiment, the dimension of the contact plug CP of the p-channel transistor Qp is relatively increased (set longer) with respect to that of the contact plug CP of the n-channel transistor Qn.

Thereby, the compressive stress applied to the extension region Ep and the channel region Cp by the contact plugs CP is increased. Since the compressive stress applied to the extension region Ep and the channel region Cp increases, the drive current of the p-channel transistor Qp according to the third embodiment is increased compared to that of the standard p-channel transistor.

Thus, in the third embodiment, it enables to suppress the deterioration of the drive current of the n-channel transistor Qn and to increase the drive current of the p-channel transistor Qp without changing the dimensions of the active region A and the element isolation region IS.

In the case where the stress applied on the active region by the contact plugs is the tensile stress, they may be formed as follows. That is, the size of the contact plug CP of the n-channel transistor Qn is set to have the minimum dimension that is defined by the design rule. Further, comparing the dimensions of the contact plugs CP of both channel transistors Qn and Qp along the direction of the channel orientation, the dimension of the contact plug CP of the p-channel transistor Qp is relatively increased with respect to that of the contact plug CP of the n-channel transistor Qn. With this, the effect which is similar to the above-described effect can be achieved.

Fourth Embodiment

FIG. 10A is an enlarged plan view of a semiconductor device according to the fourth embodiment. FIG. 10B is the cross section thereof.

In the fourth embodiment, the size of the contact plug CP of the n-channel transistor Qn is set to have the minimum dimension that is defined by the design rule. With this, the compressive stress applied to the extension region En and the channel region Cn by the contact plugs CP becomes the minimum value. Since the compressive stress upon the extension region En and the channel region Cn becomes the minimum, decrease of the drive current in the n-channel transistor Qn becomes the minimum.

Further, comparing the dimensions of the contact plugs CP of both channel transistors Qn and Qp along the longitudinal direction (vertical direction in FIG. 10A) of the gate electrode G, in the fourth embodiment, the dimension of the contact plug CP of the p-channel transistor Qp is relatively increased (set longer).

This increases the width of the range S where the compressive stress is applied to the extension region Ep and the channel region Cp through the contact plugs CP. Since the width of the range S, which is influenced by the compressive stress applied to the extension region Ep and the channel region Cp, is widened, the drive current of the p-channel transistor Qp according to the fourth embodiment is increased compared to that of the standard p-channel transistor.

Thus, in the fourth embodiment, it enables to suppress the deterioration of the drive current of the n-channel transistor Qn and to increase the drive current of the p-channel transistor Qp without changing the dimensions of the active region A and the element isolation region IS.

In the case where the stress applied on the active region by the contact plug is the tensile stress, they may be formed as follows. That is, the size of the contact plug CP of the p-channel transistor Qp is set to have the minimum dimension that is defined by the design rule. Further, comparing the dimensions of the contact plugs CP of both channel transistors Qn and Qp along the longitudinal direction of the gate electrode G, the dimension of the contact plug CP of the n-channel transistor Qn is relatively increased with respect to that of the contact plug CP of the p-channel transistor forming region Qp. With this, the effect which is similar to the above-described effect can be achieved.

Fifth Embodiment

FIG. 11A is an enlarged plan view of a semiconductor device according to the fifth embodiment. FIG. 11B is the cross section thereof.

In the fifth embodiment, the contact plugs CP of the n-channel transistor Qn are formed with a material with tensile stress, e.g., TiN, Poly-Si. With this, it enables to apply tensile stress to the extension region En and the channel region Cn through the contact plugs CP. Since the tensile stress is applied to the extension region En and the channel region Cn, the drive current in the n-channel transistor Qn is increased.

Further, in the fifth embodiment, the contact plugs CP of the p-channel transistor Qp are formed with a material with compressive stress, e.g., W, Ti, Ta. With this, it enables to apply compressive stress to the extension region Ep and the channel region Cp through the contact plugs CP. Since the compressive stress is applied to the extension region Ep and the channel region Cp, the drive current in the p-channel transistor Qp is increased.

With this, in the fifth embodiment, the drive current of both the n-channel transistor Qn and the p-channel transistor Qp can be increased without changing the dimensions of the active region A and the element isolation region IS.

Sixth Embodiment

Figure 12A:
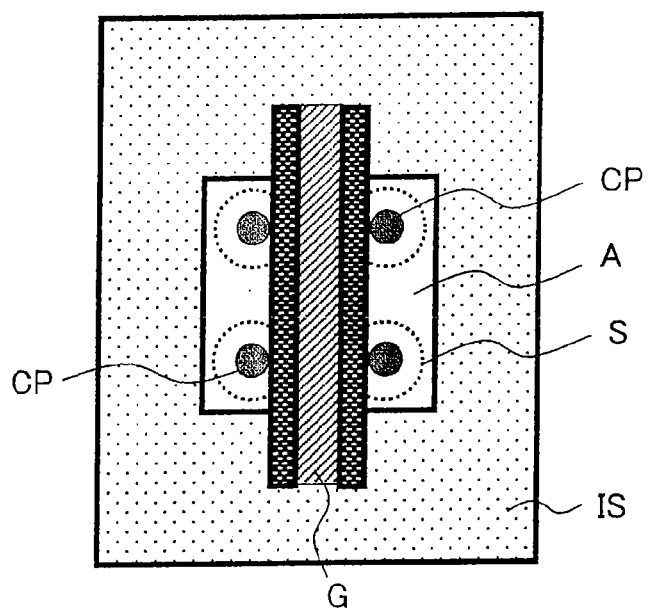
FIG. 12A is an enlarged plan view of a semiconductor device according to a sixth embodiment of the present invention.
Figure 12B:
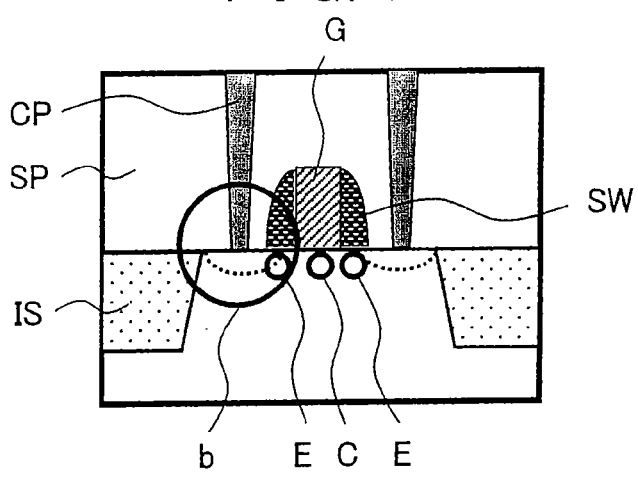
FIG. 12B is a cross section of the semiconductor device according to the sixth embodiment of the present invention.
Figure 12C:
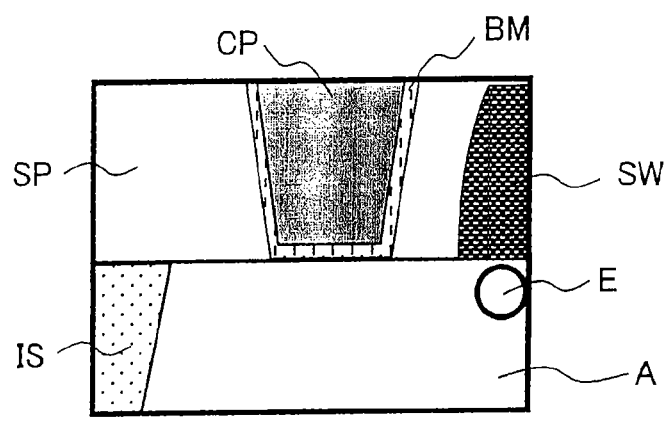
FIG. 12c is an enlarged cross section of the semiconductor device according to the sixth embodiment of the present invention.

FIG. 12A is an enlarged plan view of a semiconductor device according to the sixth embodiment, FIG. 12B is the cross section thereof, and FIG. 12C is an enlarged view of the bottom part of the contact plug shown in FIG. 12B.

The sixth embodiment pays attention the stress of barrier metal BM which is used for improving the adhesiveness between the contact plug CP and the active region A. This embodiment utilizes changes of the stress caused by the forming material, thickness, and forming condition of the barrier metal BM for changing the stress to be applied to the extension region E and the channel region C. Thereby, the effect similar to that of the fifth embodiment can be achieved. The barrier metal BM is a structure which is widely used in a semiconductor device for improving the adhesiveness between the contact plug CP and the semiconductor substrate 10.

The barrier metal BM of the n-channel transistor Qn is formed with a material with tensile stress, e.g., TiN. With this, it enables to apply tensile stress to the extension region E and the channel region C. Since the tensile stress is applied to the extension region E and the channel region C, the drive current in the n-channel transistor Qn is increased.

Further, in the sixth embodiment, the barrier metal BM of the p-channel transistor Qp is formed with a material with compressive stress, e.g., W, Ti, Ta. With this, it enables to apply compressive stress to the extension region E and the channel region C. Since the compressive stress is applied to the extension region E and the channel region C, the drive current in the p-channel transistor Qp is increased.

With this, in the sixth embodiment, the drive current of both the n-channel transistor Qn and the p-channel transistor Qp can be increased without changing the dimensions of the active region A and the element isolation region IS.

In order to increase the compressive stress and the tensile stress of the barrier metal BM, it may utilize the increase/decrease phenomenon of the stress, which is caused due to variations in the film thickness of the barrier metal. That is, when the barrier meal BM is made of a material with the compressive stress, the film thickness of the barrier metal BM of the n-channel transistor Qn is formed relatively thinner with respect to that of the standard n-channel transistor, and the film thickness of the barrier metal BM of the p-channel transistor Qp is firmed relatively thicker with respect to that of the standard p-channel transistor.

Further, when the barrier metal BM is made of a material with the tensile stress, the film thickness of the barrier metal BM of the n-channel transistor Qn is formed relatively thicker with respect to that of the standard n-channel transistor, and the film thickness of the barrier metal BM of the p-channel transistor Qp is firmed relatively thinner with respect to that of the standard p-channel transistor.

Thereby, it is possible to achieve the effect which is similar to the above-described effect. Also, the stress can be modified by changing the deposition method of the barrier metal from sputtering to CVD (chemical vapor deposition). In the sixth embodiment, it is desirable to set the deposition condition of the barrier metal to be a condition by which the internal stress is reinforced. As the deposition condition of the barrier metal by which the internal stress is reinforced, the applied voltage may be increased in the case of sputtering, for example.

Seventh Embodiment

Figure 13A:
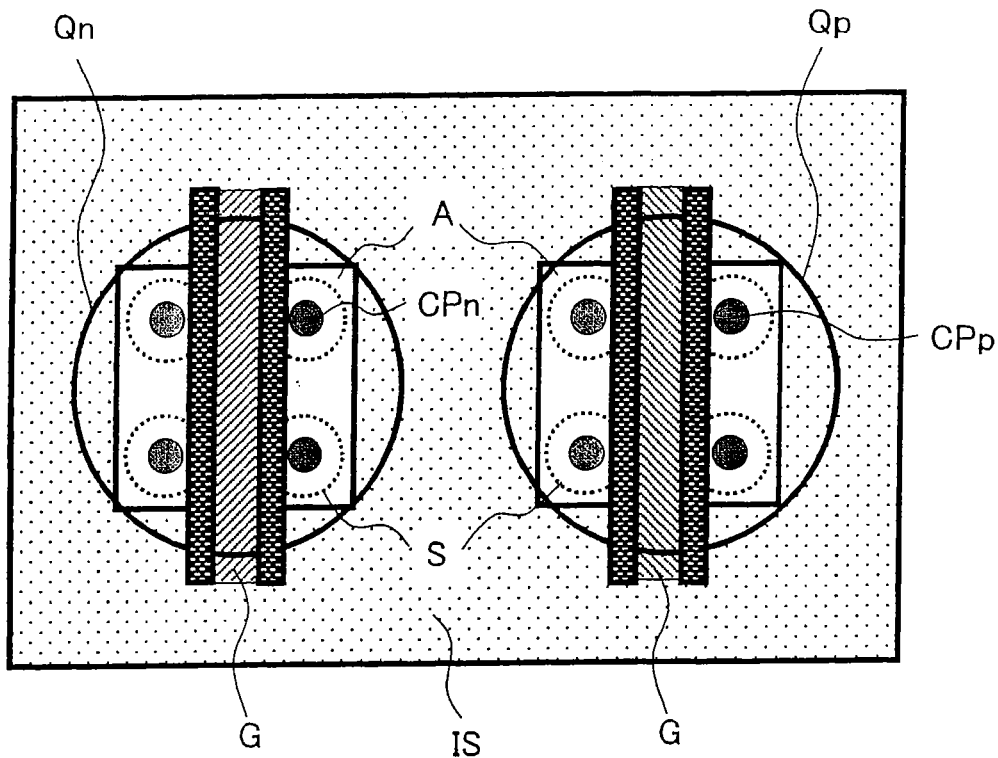
FIG. 13A is an enlarged plan view of a semiconductor device according to a seventh embodiment of the present invention.
Figure 13B:
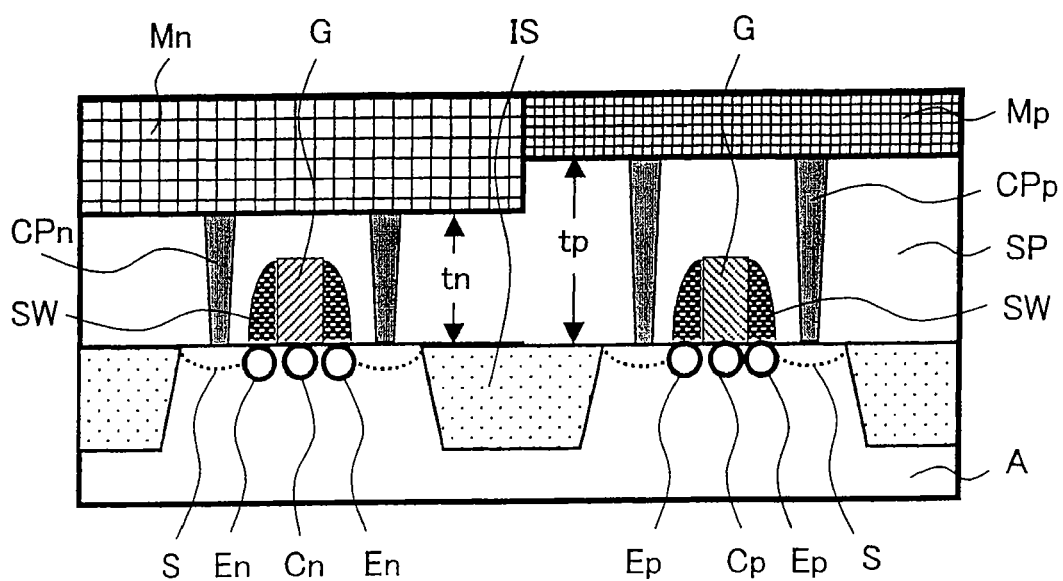
FIG. 13B is a cross section of the semiconductor device according to the seventh embodiment of the present invention.

FIG. 13A is an enlarged plan view of a semiconductor device according to the seventh embodiment. FIG. 13B is the cross section thereof.

In the seventh embodiment, height tn of contact plug CPn of the n-channel transistor Qn is relatively lowered with respect to that of the standard n-channel transistor. With this, it is possible to decrease the compressive stress applied to the extension region En and the channel region Cn through the contact plug CPn. Since the compressive stress applied to the extension region En and the channel region Cn is decreased, the drive current of the n-channel transistor Qn is increased compared to that of the standard n-channel transistor. Mn and Mp are second interlayer films.

In the meantime, when the height tn of the contact plug CPn of the p-channel transistor Qp is relatively increased with respect to that of the standard p-channel transistor, it enables to increase the compressive stress applied to the extension region Ep and the channel region Cp through the contact plug CPn. By increasing the compressive stress applied to the extension region Ep and the channel region Cp in the manner as described above, the drive current of the p-channel transistor Qp is increased compared to that of the standard p-channel transistor.

With this, in the seventh embodiment, the drive current of both the n-channel transistor Qn and the p-channel transistor Qp can be increased without changing the dimensions of the active region A and the element isolation region IS.

When the contact plug CPn is made of a material with tensile stress, the height of the contact plug CPn of the n-channel transistor Qn is relatively increased with respect to that of the standard n-channel transistor. Further, the height of the contact plug CPn of the p-channel transistor Qp is relatively lowered with respect to that of the standard p-channel transistor. Thereby, it is possible to achieve the effect which is similar to the above-described effect.

Eighth Embodiment

FIG. 14A is an enlarged plan view of a semiconductor device according to the eighth embodiment. FIG. 14B is the cross section thereof.

Among the compressive stress applied to the extension regions En, Ep and the channel regions Cn, Cp, the compressive stress applied from the contact plugs CP and the compressive stress applied from the etch-stop film ES are compared. There is described the case where the compressive stress applied from the etch-stop film ES is sufficiently small.

In the n-channel transistor Qn, isolated distance dn between the contact plug CP and the sidewall SW is set to be the widest (the widest of the design rule) as much as possible. With this, the compressive stress applied to the extension region En and the channel region Cn from the contact Plugs CP is decreased. Since the compressive stress applied to the extension region En and the channel region Cn is decreased, the drive current of the n-channel transistor Qn is increased.

In the p-channel transistor Qp, isolated distance dp between the contact plug CP and the sidewall SW is set to be the narrowest (the narrowest of the design rule) as much as possible. With this, the compressive stress applied to the extension region Ep and the channel region Cp from the contact Plugs CP is increased. Since the compressive stress applied to the extension region Ep and the channel region Cp is increased, the drive current of the p-channel transistor Qp is increased.

With this, in the eighth embodiment, the drive current of both the n-channel transistor Qn and the p-channel transistor Qp can be increased without changing the dimensions of the active region A and the element isolation region IS.

Next, among the compressive stress applied to the extension regions En, Ep and the channel regions Cn, Cp, the compressive stress applied from the contact plugs CP and the compressive stress applied from the etch-stop film ES are compared. There is described the case where the compressive stresses applied from the contact plugs CP and that from the etch-stop film ES are equivalent, or the compressive stress from the etch-stop film ES is sufficiently larger than that from the contact plugs CP.

Based on the reason which is described above by referring to FIG. 6, in the n-channel transistor Qn, the isolated distance dn between the contact plug CP and the sidewall SW is set to be the distance by which the compressive stress applied to the extension region En and the channel region Cn is most decreased in terms of the compressive stress applied from the contact plugs CP and the etch-stop film ES. For example, in the transistor property shown in FIG. 6, the isolated distance dn is set to be about 50 nm.

By decreasing the compressive stress applied to the extension region. En and the channel region Cn in this manner, the drive current of the n-channel transistor Qn is increased.

In the meantime, in the p-channel transistor Qp, the isolated distance dp between the contact plug CP and the sidewall SW is set to be as wide as possible within the range of the design rule. This enables to increase the compressive stress applied from the contact plugs CP and the compressive stress applied from the etch-stop film ES which is sectioned by the contact plug CP. By the increase of the compressive stress achieved in this manner, the compressive stress applied to the extension region Ep and the channel region Cp is increased. Thus, the drive current of the p-channel transistor Qp is increased.

With this, in the eighth embodiment, the drive current of both the n-channel transistor Qn and the p-channel transistor Qp can be increased without changing the dimensions of the active region A and the element isolation region IS. Therefore, it is possible to control the stress by the etch-stop film by providing the contact plug.

When the contact plugs CP are made of a material with tensile stress, they may be formed as follows. That is, the isolated distance between the contact plug CP of the n-channel transistor Qn and the sidewall SW is set to be the narrowest that is defined by the design rule. Further, the isolated distance between the contact plug CP of the p-channel transistor Qp and the sidewall SW is set to be the widest that is defined by the design rule. Thereby, it is possible to achieve the effect which is similar to the above-described effect.

The present invention has been described in detail by referring to the most preferred embodiments. However, various combinations and modifications of the components are possible without departing from the sprit and the broad scope of the appended claims.

What is claimed is:

1. A semiconductor device, comprising:
   an n-channel transistor forming region;
   a p-channel transistor forming region;
   contact plugs formed on both said n-channel transistor forming region and said p-channel transistor forming region; and
   an element isolation region which separates said n-channel transistor forming region and said p-channel transistor forming region, wherein first contact plugs of said contact plugs of said p-channel transistor forming region are extended in the longitudinal direction of a gate electrode with respect to second contact plugs of said contact plugs of said n-channel transistor,
   a difference between stress in said p-channel transistor forming region and stress in said n-channel transistor forming region is generated by a difference in the shapes of said first contact plugs and said second contact plugs; and one of said first contact plugs and said second contact plugs are the minimum size and the other of said first contact plugs and said second contact plugs are larger than said minimum size in a direction that is parallel with said gate electrode.

2. The semiconductor device according to claim 1, wherein stress which is generated in said n-channel transistor forming region due to said second contact plugs and stress which is generated in said p-channel transistor forming region due to said first contact plugs differs from each other.

3. The semiconductor device according to claim 1, wherein said second contact plugs in said n-channel transistor forming region and said first contact plugs in said p-channel transistor forming region are made of a material with compressive stress.

4. The semiconductor device according to claim 1, wherein said second contact plugs in said n-channel transistor forming region and said first contact plugs in said p-channel transistor forming region are made of a material with tensile stress.

5. The semiconductor device according to claim 1, wherein said second contact plugs in said n-channel transistor forming region and said first contact plugs in said p-channel transistor forming region comprise barrier metal.

6. The semiconductor device according to claim 5, wherein:
   a structure of the barrier metal used for the second contact plugs of said n-channel transistor forming region and a structure of the barrier metal used for the first contact plugs of said p-channel transistor forming region are different.

7. The semiconductor device according to claim 5, wherein:
   the forming material of the barrier metal used for the second contact plugs of said n-channel transistor forming region is a material with tensile stress and the forming material of the barrier metal used for the first contact plugs of said p-channel transistor forming region is a material with compressive stress.

8. The semiconductor device according to claim 5, wherein:
   the forming material of the barrier metal is a material with compressive stress; the film thickness of the barrier metal in the n-channel transistor forming region is set relatively thin and the film thickness of the barrier metal in the p-channel transistor forming region is set relatively thick.

9. The semiconductor device according to claim 5, wherein:
   the forming material of the barrier metal is a material with tensile stress; the film thickness of the barrier metal in the n-channel transistor forming region is set relatively thick and the film thickness of the barrier metal in the p-channel transistor forming region is set relatively thin.

10. The semiconductor device according to claim 1, wherein said second contact plugs in said n-channel transistor forming region and said first contact plugs in said p-channel transistor forming region have a different height.

11. The semiconductor device according to claim 1, wherein:
    the number of said second contact plugs of said n-channel transistor forming region and the number of said first contact plugs of said p-channel transistor forming region are different.

12. The semiconductor device according to claim 1, wherein:
    diameter of said second contact plugs of said n-channel transistor forming region is relatively small and diameter of said first contact plugs of said p-channel transistor forming region is relatively large.

13. The semiconductor device according to claim 1, wherein:
    diameter of said second contact plugs of said n-channel transistor forming region is relatively large and diameter of said first contact plugs of said p-channel transistor forming region is relatively small.

14. The semiconductor device according to claim 1, wherein:
    the size of said second contact plugs of said n-channel transistor forming region is set to be the minimum size and said first contact plugs of said p-channel transistor forming region is set to be larger than said minimum size in a direction that is parallel with a channel of said p-channel transistor forming region.

15. The semiconductor device according to claim 1, wherein:
the size of said first contact plugs of said p-channel transistor forming region is set to be the minimum size and said second contact plugs of said n-channel transistor forming region is set to be larger than said minimum size in a direction that is parallel with a channel of said n-channel transistor forming region.

16. The semiconductor device according to claim 1, wherein:
the forming material of the contact plugs is a material with compressive stress; the size of said second contact plugs of said n-channel transistor forming region is set to be the minimum size and said first contact plugs of said p-channel transistor forming region is set to be larger than said minimum size in a direction that is parallel with the gate electrode.

17. The semiconductor device according to claim 1, wherein:
the forming material of the contact plugs is a material with tensile stress; the size of said first contact plugs of said p-channel transistor forming region is set to be the minimum size and said contact plugs of said second n-channel transistor forming region is set to be larger than said minimum size in a direction that is parallel with the gate electrode.

18. The semiconductor device according to claim 1, wherein:
the forming material of the second contact plugs of said n-channel transistor forming region is a material with tensile stress and the forming material of the first contact plugs of said p-channel transistor forming region is a material with compressive stress.

19. The semiconductor device according to claim 1, wherein:
height of said second contact plugs of said n-channel transistor forming region is relatively small and height of said first contact plugs of said p-channel transistor forming region is relatively large.

20. The semiconductor device according to claim 1, wherein:
height of said second contact plugs of said n-channel transistor forming region is relatively large and height of said first contact plugs of said p-channel transistor forming region is relatively small.

21. The semiconductor device according to claim 1, wherein:
an isolated distance between said second contact plugs of said n-channel transistor forming region and said gate electrode and an isolated distance between said first contact plugs of said p-channel transistor forming region and said gate electrode are different.

22. The semiconductor device according to claim 1, wherein:
said contact plugs are made of a material with compressive stress; and said isolated distance between said second contact plugs of said second n-channel transistor forming region and said gate electrode is relatively wide and said isolated distance between said first contact plugs of said p-channel transistor forming region and said gate electrode is relatively narrow.

23. The semiconductor device according to claim 1, wherein:
said contact plugs are made of a material with tensile stress; and said isolated distance between said second contact plugs of said n-channel transistor forming region and said gate electrode is relatively narrow and said isolated distance between said first contact plugs of said p-channel transistor forming region and said gate electrode is relatively wide.

* * * * *